United States Patent
Naganuma et al.

(10) Patent No.: US 8,749,229 B2
(45) Date of Patent: Jun. 10, 2014

(54) ROTATION ANGLE SENSOR

(75) Inventors: Hiroshi Naganuma, Tokyo (JP); Hiraku Hirabayashi, Tokyo (JP); Shunji Saruki, Tokyo (JP)

(73) Assignee: TDK Corporation, Tokyo (JP)

(*) Notice: Subject to any disclaimer, the term of this patent is extended or adjusted under 35 U.S.C. 154(b) by 206 days.

(21) Appl. No.: 13/301,076

(22) Filed: Nov. 21, 2011

(65) Prior Publication Data

US 2012/0176126 A1     Jul. 12, 2012

(30) Foreign Application Priority Data

Jan. 12, 2011   (JP) ................. 2011-003552

(51) Int. Cl.
*G01B 7/30*     (2006.01)
(52) U.S. Cl.
USPC .................................... 324/207.25
(58) Field of Classification Search
USPC .................................... 324/207.25
See application file for complete search history.

(56) References Cited

U.S. PATENT DOCUMENTS

2006/0214656 A1*  9/2006  Sudo et al. ............... 324/207.21

FOREIGN PATENT DOCUMENTS

| JP | A-2007-093280 | 4/2007 |
| JP | A-2010-066196 | 3/2010 |

* cited by examiner

*Primary Examiner* — Reena Aurora
(74) *Attorney, Agent, or Firm* — Oliff PLC

(57) ABSTRACT

A rotation angle sensor includes a magnet that rotates about a rotation axis. The magnet has an end face perpendicular to the rotation axis and has a magnetization in a direction perpendicular to the rotation axis. The rotation angle sensor further includes a magnetic sensor that faces the end face of the magnet and detects a magnetic field produced by the magnet. The magnet includes a plate-shaped portion including the end face, and a ring-shaped portion that is located on a side of the plate-shaped portion farther from the end face and coupled to the plate-shaped portion. The plate-shaped portion does not include any hollow through which the rotation axis passes, whereas the ring-shaped portion includes a hollow through which the rotation axis passes.

4 Claims, 16 Drawing Sheets

ROTATION ANGLE SENSOR

BACKGROUND OF THE INVENTION

1. Field of the Invention

The present invention relates to a rotation angle sensor that includes a rotating magnet and a magnetic sensor for detecting a magnetic field produced by the magnet, the rotation angle sensor detecting the rotation angle of the magnet.

2. Description of the Related Art

In recent years, magnetic rotation angle sensors have been widely employed to detect the rotational position of an object for various types of use such as for detecting the rotational position of the steering of automobiles. For example, JP-A-2007-93280 and JP-A-2010-66196 disclose a magnetic rotation angle sensor that includes a rotating magnet and a magnetic sensor for detecting a magnetic field produced by the magnet. The magnetic rotation angle sensor detects the rotation angle of the magnet on the basis of the detection output from the magnetic sensor.

In the rotation angle sensor that includes a rotating magnet and a magnetic sensor, for example, the magnet has an end face perpendicular to the rotation axis and has a magnetization in a direction perpendicular to the rotation axis, while the magnetic sensor is disposed to face the end face of the magnet with a predetermined spacing therebetween. The performances required of the rotation angle sensor having such a configuration are that the magnetic field that is produced by the magnet and applied to the magnetic sensor should be high in strength and that a difference between the actual rotation angle of the magnet and the rotation angle of the magnet detected on the basis of the detection output from the magnetic sensor should be small. The rotation angle of the magnet detected on the basis of the detection output from the magnetic sensor will hereinafter be referred to as the detection angle. The difference between the actual rotation angle and the detection angle will hereinafter be referred to as the angle error.

The magnetic sensor may be subjected not only to the magnetic field produced by the magnet but also to another magnetic field such as a leakage magnetic field from a motor or the earth's magnetic field. The requirement that the magnetic field that is produced by the magnet and applied to the magnetic sensor should be high in strength is inevitable to relatively reduce the effects of the magnetic fields to be applied to the magnetic sensor other than the magnetic field that is produced by the magnet. Increasing the strength of the magnetic field that is produced by the magnet and applied to the magnetic sensor can be achieved by, for example, forming the magnet from a magnetic material that has a high residual flux density or increasing the size of the magnet.

On the other hand, one cause of the angle error is a misalignment between the magnet and the magnetic sensor. The positions of the magnet and the magnetic sensor relative to each other may slightly deviate from their desired positions during the fabrication of the rotation angle sensor or during use of the rotation angle sensor. It is assumed here that on a virtual plane parallel to the end face of the magnet, the direction of the magnetic field produced by the magnet is parallel to the direction of magnetization of the magnet when seen at the position at which the rotation axis intersects the virtual plane. The aforementioned position will hereinafter be referred to as the center position. On the virtual plane, the position of the magnetic sensor at which the rotation axis passes through the center of the magnetic sensor is assumed to be a desired position of the magnetic sensor. At a position away from the center position on the aforementioned virtual plane, the direction of the magnetic field produced by the magnet may be different from that at the center position. Accordingly, when the position of the magnetic sensor deviates from the desired position on the aforementioned virtual plane, the direction of the magnetic field detected by the magnetic sensor may be different from that detected when the magnetic sensor is located at the desired position. An angle error can thus occur due to a misalignment between the magnet and the magnetic sensor. The rotation angle sensor is required to have a small angle error even in the presence of a misalignment between the magnet and the magnetic sensor.

JP-A-2007-93280 discloses a technology for reducing the angle error for a rotation angle sensor that has a disc magnet and a magneto-electric transducer, by disposing the magneto-electric transducer at such a position that the angle error resulting from a misalignment of the rotation axis of the disc magnet is reduced.

JP-A-2010-66196 discloses a technology for reducing the angle error by devising the shape of the magnet and the arrangement of the magnetic detector section. In the technology, the magnet has a proximal portion around the center axis of rotation, a first outer peripheral portion outside the proximal portion, and a second outer peripheral portion outside the first outer peripheral portion. The thickness of the proximal portion in a direction parallel to the center axis of rotation is greater than the thickness of each of the first outer peripheral portion and the second outer peripheral portion in the direction parallel to the center axis of rotation.

For a rotation angle sensor that includes a rotating magnet and a magnetic sensor, as described above, it is required that the magnetic field produced by the magnet and applied to the magnetic sensor should be high in strength and that the angle error resulting from a misalignment between the magnet and the magnetic sensor should be small. To meet these requirements, a possible approach is to increase the strength of the magnetic field produced by the magnet and locate the magnetic sensor at such a position that the angle error resulting from a misalignment between the magnet and the magnetic sensor is reduced.

The inventors of this application have found by simulation that in the vicinity of the end face of a cylindrical magnet, there exists a region in which the direction of the magnetic field is substantially the same as the direction of the magnetic field at the desired position. Such a region will hereinafter be referred to as the parallel field region. The inventors have also found that the area of the parallel field region on a virtual plane parallel to the end face of the magnet varies depending on the distance between the end face of the magnet and the virtual plane. It can thus be thought that locating the magnetic sensor on a virtual plane that maximizes the area of the parallel field region would reduce the angle error resulting from a misalignment between the magnet and the magnetic sensor.

On the other hand, to increase the strength of the magnetic field produced by a cylindrical magnet, increasing the magnet in thickness (dimension in the direction of the rotation axis) is effective. However, it has been found that increasing the magnet in thickness would cause the following problem. That is, it has been found by simulation that increasing the magnet in thickness reduces the distance between the end face of the magnet and the virtual plane that maximizes the area of the parallel field region. Accordingly, if the magnet is increased in thickness and the magnetic sensor is located on the virtual plane that maximizes the area of the parallel field region, the distance between the end face of the magnet and the magnetic sensor may be excessively reduced to cause the magnetic sensor to contact and damage the magnet.

As such, in the case of using a cylindrical magnet, it is difficult to increase the strength of the magnetic field produced by the magnet and applied to the magnetic sensor and reduce the angle error resulting from a misalignment between the magnet and the magnetic sensor without causing an excessive decrease in the distance between the magnet and the magnetic sensor. The technologies disclosed in JP-A-2007-93280 and JP-A-2010-66196 could not solve the problem.

OBJECT AND SUMMARY OF THE INVENTION

It is an object of the present invention to provide a rotation angle sensor that includes a rotating magnet and a magnetic sensor for detecting a magnetic field produced by the magnet, the rotation angle sensor detecting the rotation angle of the magnet and being capable of increasing the strength of the magnetic field produced by the magnet and applied to the magnetic sensor and reducing the angle error resulting from a misalignment between the magnet and the magnetic sensor, without causing an excessive decrease in the distance between the magnet and the magnetic sensor.

A rotation angle sensor of the present invention includes: a magnet that rotates about a rotation axis, the magnet having an end face perpendicular to the rotation axis and having a magnetization in a direction perpendicular to the rotation axis; and a magnetic sensor that faces the end face of the magnet and detects a magnetic field produced by the magnet. The rotation angle sensor detects the rotation angle of the magnet based on a detection output from the magnetic sensor. The magnet includes a plate-shaped portion including the end face of the magnet, and a ring-shaped portion that is located on a side of the plate-shaped portion farther from the end face and coupled to the plate-shaped portion. The plate-shaped portion does not include any hollow through which the rotation axis passes, whereas the ring-shaped portion includes a hollow through which the rotation axis passes.

In the rotation angle sensor of the present invention, any cross section of the magnet including the rotation axis may have a shape symmetric about the rotation axis. In this case, the plate-shaped portion may be shaped like a circular plate, and the ring-shaped portion may have an outer periphery and an inner periphery that are both circular in any cross section of the ring-shaped portion perpendicular to the rotation axis.

The rotation angle sensor of the present invention may be configured so that on a virtual plane that is parallel to the end face of the magnet and apart from the end face by a distance equal to the distance between the end face and the magnetic sensor, the magnetic field produced by the magnet is in directions parallel to each other at a first position and a second position, the first position being a position at which the rotation axis intersects the virtual plane, the second position being different from the first position.

In the rotation angle sensor of the present invention, the magnetic sensor may include a magnetoresistive element.

In the rotation angle sensor of the present invention, the magnet includes a plate-shaped portion including the end face that the magnetic sensor faces, and a ring-shaped portion that is located on a side of the plate-shaped portion farther from the end face and coupled to the plate-shaped portion. The plate-shaped portion does not include any hollow through which the rotation axis passes, whereas the ring-shaped portion includes a hollow through which the rotation axis passes. The magnet of the present invention is capable of increasing the strength of the magnetic field that is produced by the magnet and applied to the magnetic sensor, when compared with a cylindrical magnet under such a condition that, for example, the optimum distance between the end face of the magnet and the magnetic sensor is almost the same for the two magnets. As used herein, the optimum distance means a distance between the end face of the magnet and the magnetic sensor that allows reducing the angle error resulting from a misalignment between the magnet and the magnetic sensor. Furthermore, the magnet of the present invention is capable of increasing the optimum distance when compared with a cylindrical magnet under such a condition that, for example, the strength of the aforementioned magnetic field at the optimum distance is almost the same for the two magnets. Consequently, the present invention makes it possible to increase the strength of the magnetic field produced by the magnet and applied to the magnetic sensor and reduce the angle error resulting from a misalignment between the magnet and the magnetic sensor, without causing an excessive decrease in the distance between the magnet and the magnetic sensor.

Other and further objects, features and advantages of the present invention will appear more fully from the following description.

DETAILED DESCRIPTION OF THE PREFERRED EMBODIMENT

Figure 1:
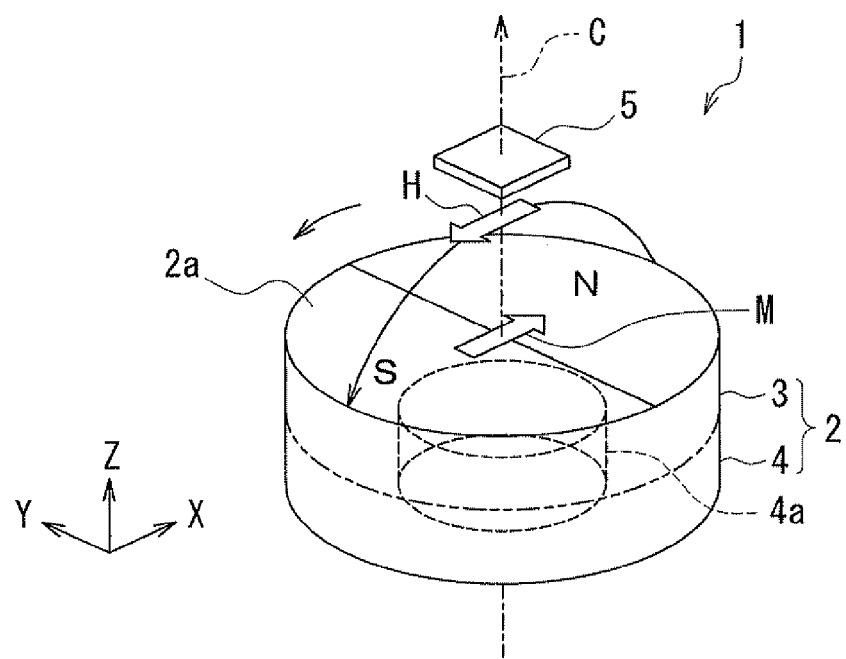
FIG. 1 is a perspective view showing the general configuration of a rotation angle sensor according to an embodiment of the invention.
Figure 2:
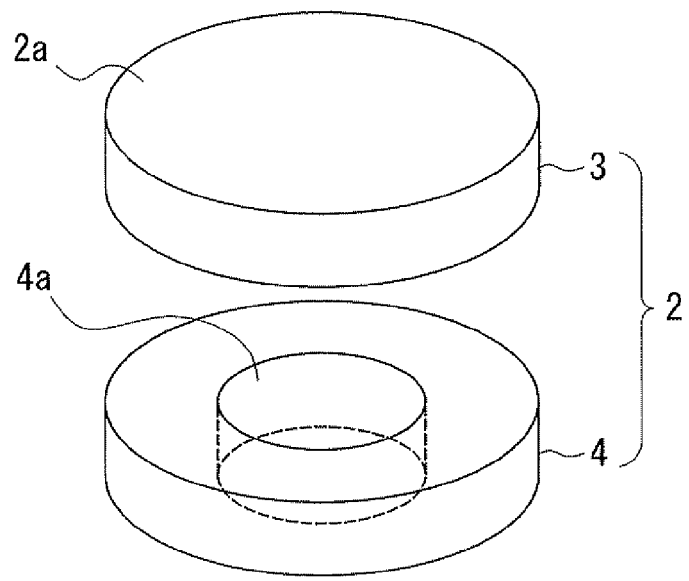
FIG. 2 is an exploded perspective view of the magnet shown in FIG. 1.
Figure 3:
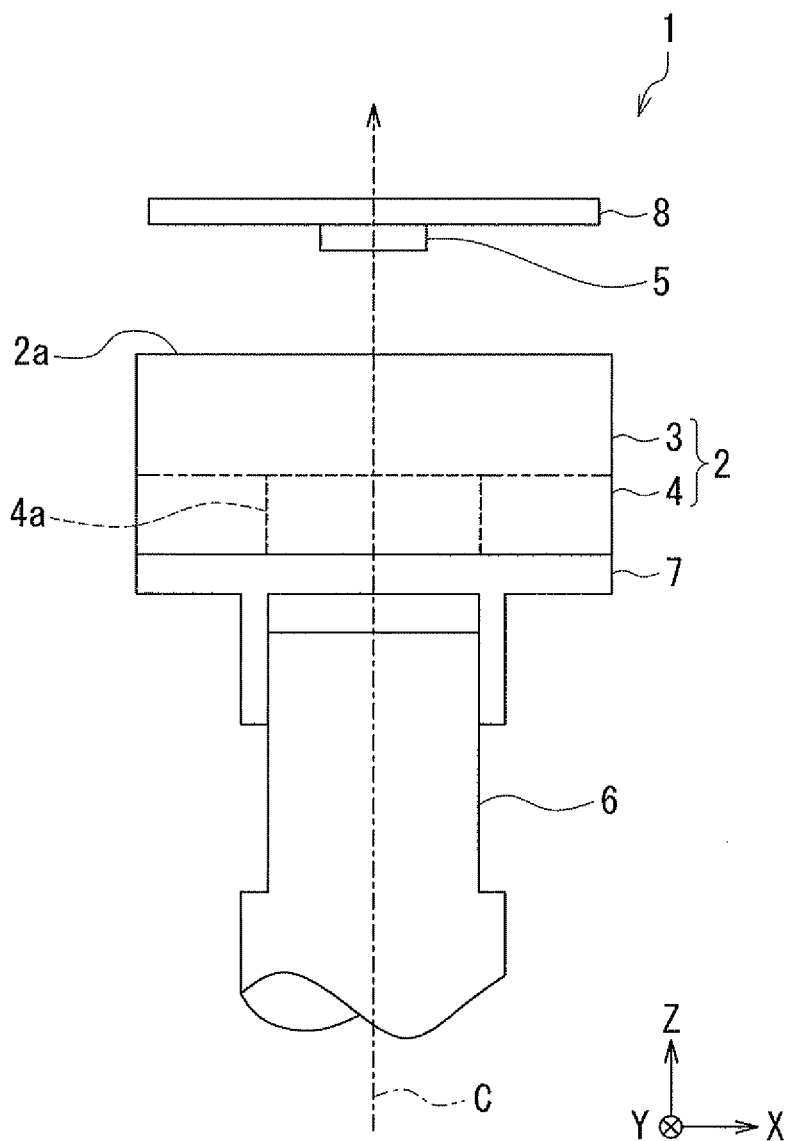
FIG. 3 is a side view showing the general configuration of the rotation angle sensor according to the embodiment of the invention.
Figure 4:
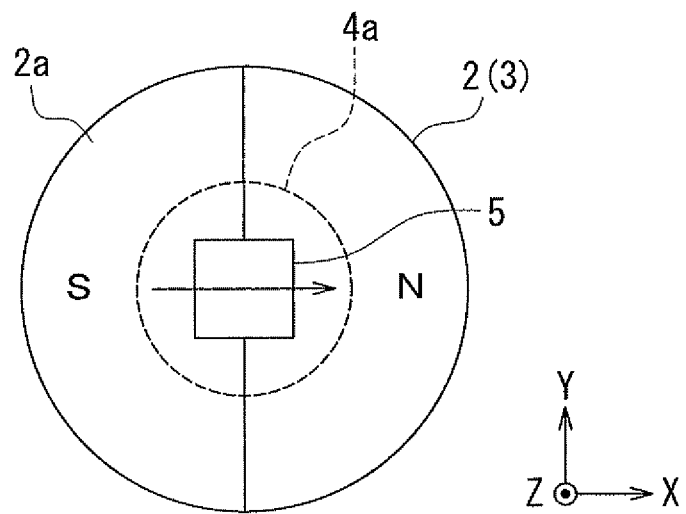
FIG. 4 is a plan view showing the magnet and the magnetic sensor in the rotation angle sensor shown in FIG. 3.
Figure 5:
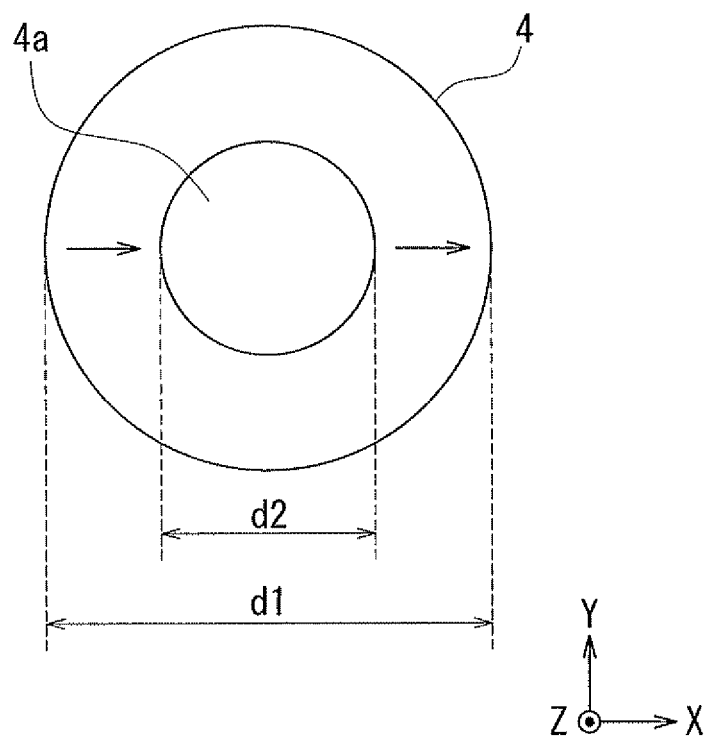
FIG. 5 is a bottom view of the magnet shown in FIG. 3.
Figure 6:
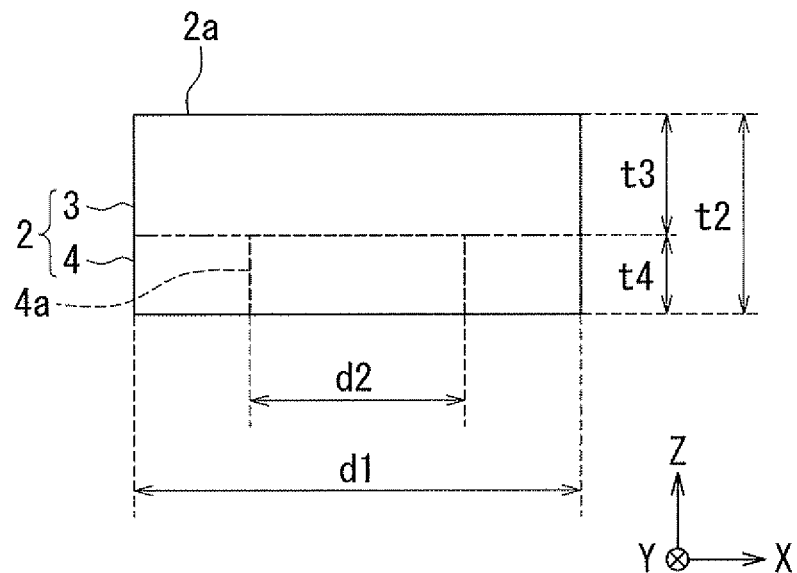
FIG. 6 is a side view of the magnet shown in FIG. 3.
Figure 7:
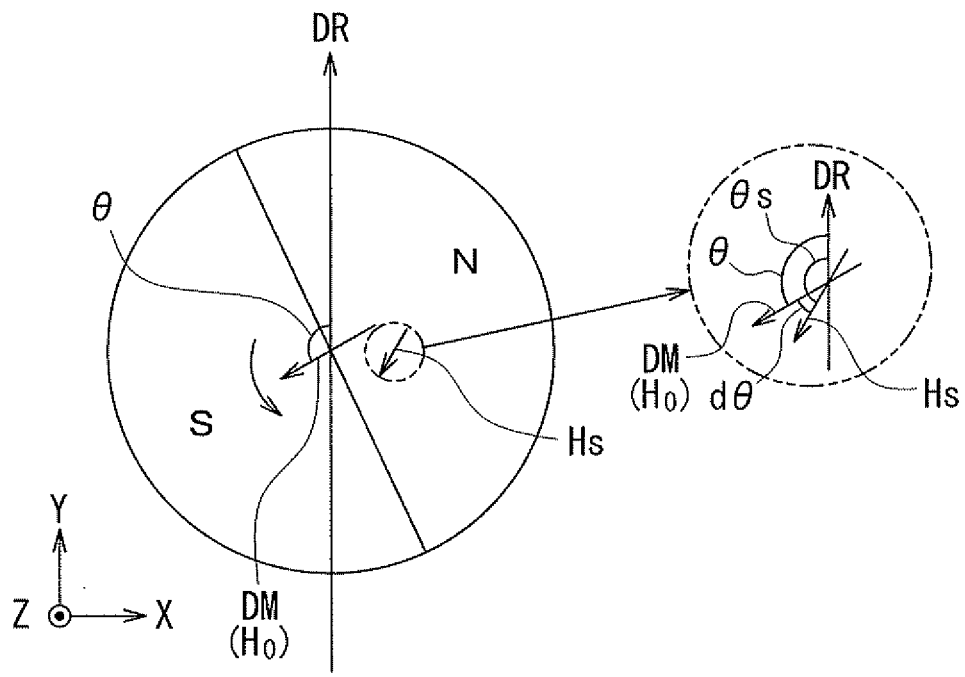
FIG. 7 is an explanatory diagram illustrating the definitions of directions and angles in the embodiment of the invention.

A preferred embodiment of the present invention will now be described in detail with reference to the drawings. First, reference is made to FIG. 1 to FIG. 7 to describe the general configuration of a rotation angle sensor according to an embodiment of the invention. FIG. 1 is a perspective view showing the general configuration of the rotation angle sensor according to the embodiment. FIG. 2 is an exploded perspective view of the magnet shown in FIG. 1. FIG. 3 is a side view showing the general configuration of the rotation angle sensor according to the embodiment. FIG. 4 is a plan view showing the magnet and the magnetic sensor in the rotation angle sensor shown in FIG. 3. FIG. 5 is a bottom view of the magnet shown in FIG. 3. FIG. 6 is a side view of the magnet shown in FIG. 3. FIG. 7 is an explanatory diagram illustrating the definitions of directions and angles in the embodiment.

As shown in FIG. 1 and FIG. 3, the rotation angle sensor 1 according to the embodiment includes a magnet 2, a substrate 8 (see FIG. 3), and a magnetic sensor 5 mounted on the substrate 8. The magnet 2 is secured to one axial end of a shaft 6 via a securing jig 7. The shaft 6 rotates about a rotation axis C. The magnet 2 rotates about the rotation axis C in conjunction with the shaft 6 being rotated.

The magnet 2 has an end face 2a perpendicular to the rotation axis C, and has a magnetization in a direction perpendicular to the rotation axis C. The magnet 2 includes a plate-shaped portion 3 including the end face 2a, and a ring-shaped portion 4 that is located on a side of the plate-shaped portion 3 farther from the end face 2a and coupled to the plate-shaped portion 3. The plate-shaped portion 3 does not include any hollow through which the rotation axis C passes, whereas the ring-shaped portion 4 includes a hollow 4a through which the rotation axis C passes.

The plate-shaped portion 3 has an N pole and an S pole that are arranged symmetrically about a virtual plane including the rotation axis C. The direction of magnetization of the magnet 2 is from the S pole to the N pole of the plate-shaped portion 3, and perpendicular to the boundary between the S pole and the N pole. In FIG. 1, the arrow with symbol M indicates the direction of magnetization of the magnet 2. The plate-shaped portion 3 and the ring-shaped portion 4 have magnetization in the same direction as the direction of magnetization of the magnet 2. In FIG. 4, the arrow drawn on the plate-shaped portion 3 indicates the direction of magnetization of the plate-shaped portion 3. In FIG. 5, the arrows drawn on the ring-shaped portion 4 indicate the direction of magnetization of the ring-shaped portion 4.

The magnet 2 produces a magnetic field based on its own magnetization. In FIG. 1, the arrow with symbol H indicates the direction of the magnetic field produced by the magnet 2 when seen at a position on the rotation axis C in the vicinity of the end face 2a.

The substrate 8 has a surface that faces toward the end face 2a of the magnet 2. The magnetic sensor 5 is secured to this surface of the substrate 8. The magnetic sensor 5 faces the end face 2a of the magnet 2 and detects the magnetic field produced by the magnet 2. The rotation angle sensor 1 detects the rotation angle of the magnet 2 based on the detection output from the magnetic sensor 5.

Any cross section of the magnet 2 including the rotation axis C has a shape symmetric about the rotation axis C. FIG. 1 to FIG. 7 illustrate an example of the shape of the magnet 2. In this example, the plate-shaped portion 3 is shaped like a circular plate and, in any cross section of the ring-shaped portion 4 perpendicular to the rotation axis C, both the outer and inner peripheries of the ring-shaped portion 4 have a circular shape centered around the rotation axis C.

Here, as shown in FIG. 5 and FIG. 6, the diameter of the magnet 2 will be represented by symbol d1, and the inner diameter of the ring-shaped portion 4, that is, the diameter of the hollow 4a, will be represented by symbol d2. The diameter of the plate-shaped portion 3 and the diameter of the ring-shaped portion 4 are equal to the diameter d1 of the magnet 2. As shown in FIG. 6, the thicknesses (dimensions in a direction parallel to the rotation axis C) of the magnet 2, the plate-shaped portion 3, and the ring-shaped portion 4 will be represented by symbols t2, t3, and t4, respectively.

Now, with reference to FIG. 7, the definitions of directions and angles in the embodiment will be described. First, a direction that is parallel to the rotation axis C shown in FIG. 1 and is from the end face 2a of the magnet 2 to the magnetic sensor 5 is defined as Z direction. Next, two mutually orthogonal directions on a virtual plane perpendicular to the Z direction are defined as X direction and Y direction. In FIG. 7, the X direction is shown as the direction toward the right, and the Y direction is shown as the upward direction. The direction opposite to the X direction is defined as −X direction. The direction opposite to the Y direction is defined as −Y direction.

In order to express the rotation angle of the magnet 2, a reference direction DR in the space and a magnet reference direction DM that rotates in conjunction with the magnet 2 will be defined. The reference direction DR shall be, for example, the Y direction. The magnet reference direction DM is defined as, for example, the direction opposite to the direction of magnetization of the magnet 2. Furthermore, the angle that the magnet reference direction DM forms with respect to the reference direction DR is defined as the rotation angle θ of the magnet 2. The magnet 2 and the magnet reference direction DM are assumed to rotate in a counterclockwise direction in FIG. 7. The angle θ is expressed in a positive value when seen in a counterclockwise direction from the reference direction DR, and in a negative value when seen in a clockwise direction from the reference direction DR.

Here, consider a virtual plane that is parallel to the end face 2a of the magnet 2 and apart from the end face 2a by a distance equal to the distance between the end face 2a and the magnetic sensor 5. This virtual plane will hereinafter be referred to as the sensor mount surface. The magnetic sensor 5 detects a magnetic field produced by the magnet 2 substantially on the sensor mount surface. Symbol $H_0$ represents the magnetic field produced by the magnet 2, detected at a position on the sensor mount surface at which the rotation axis C intersects the sensor mount surface. The direction of the magnetic field $H_0$ is parallel to the direction of magnetization of the magnet 2, and agrees with the magnet reference direction DM. Consequently, the angle that the direction of the magnetic field $H_0$ forms with respect to the reference direction DR agrees with the angle θ.

Symbol $H_S$ represents the magnetic filed on the sensor mount surface, produced by the magnet 2 and applied to the magnetic sensor 5. The magnetic sensor 5 detects the magnetic field $H_S$. The rotation angle sensor 1 detects the rotation angle θ of the magnet 2 based on the detection output from the magnetic sensor 5. In practice, based on the detection output from the magnetic sensor 5, the rotation angle sensor 1 detects an angle θs that the direction of the magnetic field $H_S$ forms with respect to the reference direction DR, as an angle corresponding to the rotation angle θ. The angle θs will hereinafter be referred to as the detection angle. The definition of positive and negative detection angles θs is the same as that for the angle θ. Ideally, the detection angle θs agrees with the rotation angle θ.

Such a position of the magnetic sensor 5 that the rotation axis C passes through the center of the magnetic sensor 5 will be defined as the desired position of the magnetic sensor 5. When the magnetic sensor 5 is located at the desired position, the magnetic field $H_S$ is equal to the magnetic field $H_0$, and accordingly, the detection angle θs is equal to the rotation angle θ. When the magnetic sensor 5 is located at a position offset from the desired position on the sensor mount surface, however, the direction of the magnetic field $H_S$ may be different from the direction of the magnetic field $H_0$. FIG. 7 illustrates an example of such a case. In this case, the detection angle θs does not agree with the rotation angle θ. The difference between the detection angle θs and the rotation angle θ will be referred to as the angle error and represented by symbol dθ. In the example shown in FIG. 7, the angle error dθ is equal to the angle that the direction of the magnetic field $H_S$ forms with respect to the direction of the magnetic field $H_0$. The definition of positive and negative angle errors dθ is the same as that for the angle θ.

Figure 8:
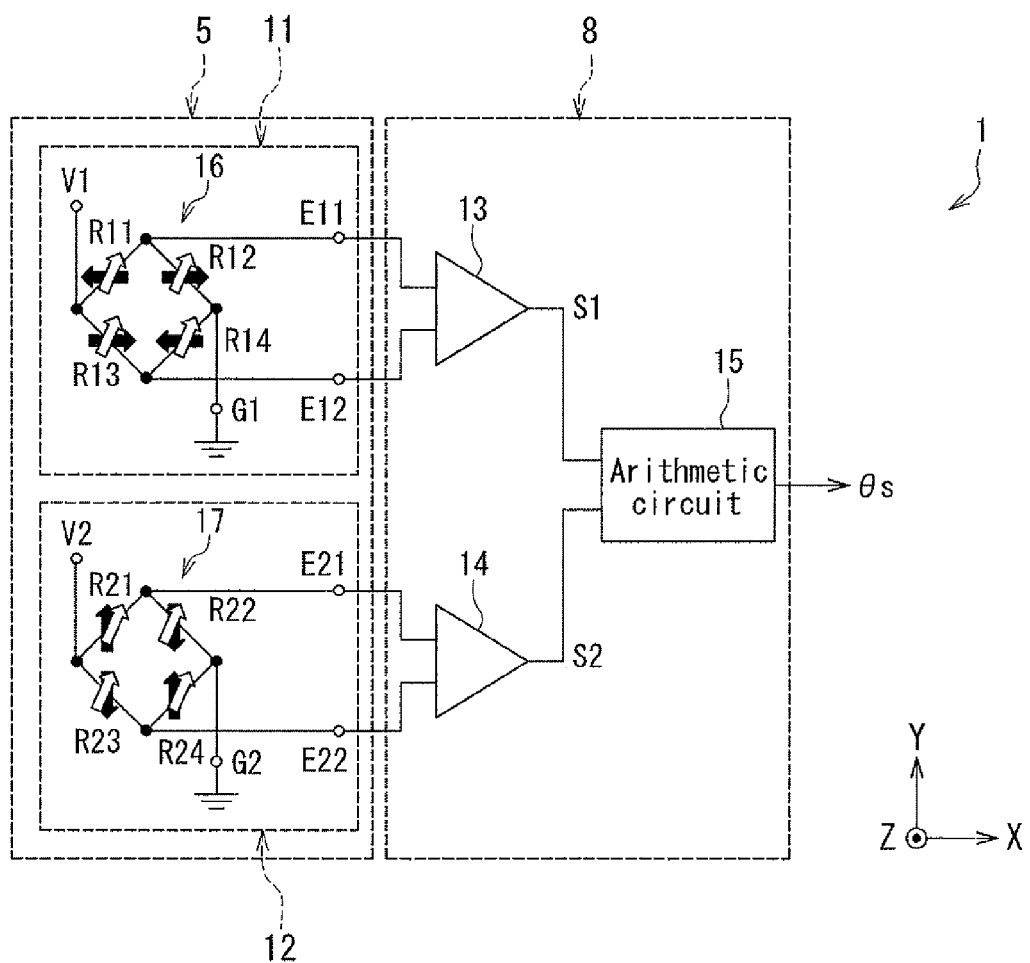
FIG. 8 is a circuit diagram showing the circuit configuration of the rotation angle sensor according to the embodiment of the invention.

Reference is now made to FIG. 8 to describe the circuit configuration of the rotation angle sensor 1. FIG. 8 is a circuit diagram showing the circuit configuration of the rotation angle sensor 1. The magnetic sensor 5 includes a first detection circuit 11 and a second detection circuit 12. The substrate 8 has difference detectors 13 and 14, and an arithmetic circuit 15. The arithmetic circuit 15 can be implemented by a microcomputer, for example.

The first detection circuit 11 detects the strength of a component of the magnetic field $H_S$ in one direction, and outputs a signal that indicates the strength. The second detection circuit 12 detects the strength of a component of the magnetic field $H_S$ in another direction, and outputs a signal that indicates the strength. Each of the first and second detection circuits 11 and 12 includes at least one magnetic detection element.

Each of the first and second detection circuits 11 and 12 may include, as the at least one magnetic detection element, a pair of magnetic detection elements connected in series. In this case, each of the first and second detection circuits 11 and 12 may have a Wheatstone bridge circuit that includes a first pair of magnetic detection elements connected in series and a second pair of magnetic detection elements connected in series. The following description will deal with the case where each of the first and second detection circuits 11 and 12 has such a Wheatstone bridge circuit.

The first detection circuit 11 has a Wheatstone bridge circuit 16. The Wheatstone bridge circuit 16 includes a power supply port V1, a ground port G1, two output ports E11 and E12, a first pair of magnetic detection elements R11 and R12 connected in series, and a second pair of magnetic detection elements R13 and R14 connected in series. One end of each of the magnetic detection elements R11 and R13 is connected to the power supply port V1. The other end of the magnetic detection element R11 is connected to one end of the magnetic detection element R12 and the output port E11. The other end of the magnetic detection element R13 is connected to one end of the magnetic detection element R14 and the output port E12. The other end of each of the magnetic detection elements R12 and R14 is connected to the ground port G1. A power supply voltage of predetermined magnitude is applied to the power supply port V1. The ground port G1 is grounded.

The second detection circuit 12 has a Wheatstone bridge circuit 17. The Wheatstone bridge circuit 17 includes a power supply port V2, a ground port G2, two output ports E21 and E22, a first pair of magnetic detection elements R21 and R22 connected in series, and a second pair of magnetic detection elements R23 and R24 connected in series. One end of each of the magnetic detection elements R21 and R23 is connected to the power supply port V2. The other end of the magnetic detection element R21 is connected to one end of the magnetic detection element R22 and the output port E21. The other end of the magnetic detection element R23 is connected to one end of the magnetic detection element R24 and the output port E22. The other end of each of the magnetic detection elements R22 and R24 is connected to the ground port G2. A power supply voltage of predetermined magnitude is applied to the power supply port V2. The ground port G2 is grounded.

In the embodiment, all the magnetic detection elements included in the Wheatstone bridge circuits (hereinafter, referred to as bridge circuits) 16 and 17 are magnetoresistive (MR) elements, or tunneling magnetoresistive (TMR) elements in particular. Giant magnetoresistive (GMR) elements may be employed instead of the TMR elements. The TMR elements or GMR elements each have a magnetization pinned layer whose magnetization direction is pinned, a free layer whose magnetization direction varies according to the direction of a magnetic field applied thereto, and a nonmagnetic layer disposed between the magnetization pinned layer and the free layer. For TMR elements, the nonmagnetic layer is a tunnel barrier layer. For GMR elements, the nonmagnetic layer is a nonmagnetic conductive layer. The TMR elements or GMR elements vary in resistance depending on the angle that the magnetization direction of the free layer forms with respect to the magnetization direction of the magnetization pinned layer. The resistance reaches its minimum value when the foregoing angle is 0°. The resistance reaches its maximum value when the foregoing angle is 180°. In the following description, the magnetic detection elements included in the bridge circuits 16 and 17 will be referred to as MR elements. In FIG. 8, the filled arrows indicate the magnetization directions of the magnetization pinned layers in the MR elements. The hollow arrows indicate the magnetization directions of the free layers in the MR elements.

In the first detection circuit 11, the magnetization pinned layers of the MR elements R11 and R14 are magnetized in the −X direction, and the magnetization pinned layers of the MR elements R12 and R13 are magnetized in the X direction. In this case, the potential difference between the output ports E11 and E12 varies according to the strength of the component of the magnetic field $H_S$ in the −X direction. The first detection circuit 11 therefore detects the strength of the component of the magnetic field $H_S$ in the −X direction, and outputs a signal that indicates the strength. More specifically, the potential difference between the output ports E11 and E12 is the output signal of the first detection circuit 11. When the angle $\theta_S$ shown in FIG. 7 is 0° and 180°, the strength of the component of the magnetic field $H_S$ in the −X direction is zero. When the angle $\theta_S$ is greater than 0° and smaller than 180°, the strength of the component of the magnetic field $H_S$ in the −X direction is positive in value. When the angle $\theta_S$ is greater than 180° and smaller than 360°, the strength of the component of the magnetic field $H_S$ in the −X direction is negative in value.

In the second detection circuit 12, the magnetization pinned layers of the MR elements R21 and R24 are magnetized in the Y direction, and the magnetization pinned layers of the MR elements R22 and R23 are magnetized in the −Y direction. In this case, the potential difference between the output ports E21 and E22 varies according to the strength of the component of the magnetic field $H_S$ in the Y direction. The second detection circuit 12 therefore detects the strength of the component of the magnetic field $H_S$ in the Y direction, and outputs a signal that indicates the strength. More specifically, the potential difference between the output ports E21 and E22 is the output signal of the second detection circuit 12. When the angle $\theta_S$ shown in FIG. 7 is 90° and 270°, the strength of the component of the magnetic field $H_S$ in the Y direction is zero. When the angle $\theta_S$ is equal to or greater than 0° and smaller than 90°, and when the angle $\theta_S$ is greater than 270° and smaller than or equal to 360°, the strength of the component of the magnetic field $H_S$ in the Y direction is positive in value. When the angle $\theta_S$ is greater than 90° and smaller than 270°, the strength of the component of the magnetic field $H_S$ in the Y direction is negative in value.

The difference detector 13 outputs a signal that corresponds to the potential difference between the output ports E11 and E12 to the arithmetic circuit 15 as a first signal S1. The difference detector 14 outputs a signal that corresponds to the potential difference between the output ports E21 and E22 to the arithmetic circuit 15 as a second signal S2. The first signal S1 and the second signal S2 vary periodically with the same signal period T. In the embodiment, the second signal S2 preferably differs from the first signal S1 in phase by an odd number of times ¼ the signal period T. However, in consideration of the production accuracy of the magnetic detection elements and other factors, the difference in phase between the first signal S1 and the second signal S2 may be slightly different from an odd number of times ¼ the signal period T. The following description assumes that the phase of the first signal S1 and the phase of the second signal S2 satisfy the preferred relationship described above.

In the example shown in FIG. 8, the magnetization directions of the magnetization pinned layers of the MR elements in the second detection circuit 12 are orthogonal to the magnetization directions of the magnetization pinned layers of the MR elements in the first detection circuit 11. Ideally, the first signal S1 has a sine waveform whereas the second signal S2 has a cosine waveform. In this case, the second signal S2 differs from the first signal S1 in phase by ¼ the signal period T, i.e., by π/2(90°). The arithmetic circuit 15 calculates the detection angle $\theta_S$ based on the first signal S1 and the second signal S2. Specifically, for example, the arithmetic circuit 15 calculates $\theta_S$ by the equation (1) below. Note that "atan" represents an arctangent.

$$\theta_S = \text{atan}(S1/S2) \quad (1)$$

The term "atan (S1/S2)" of the equation (1) represents the arctangent calculation for determining $\theta_S$. Within the range of 360°, $\theta_S$ in the equation (1) has two solutions with a difference of 180° in value. Which of the two solutions of $\theta_S$ in the equation (1) is the true solution to $\theta_S$ can be determined from the combination of positive and negative signs on S1 and S2. More specifically, if S1 is positive in value, $\theta_S$ is greater than 0° and smaller than 180°. If S1 is negative in value, $\theta_S$ is greater than 180° and smaller than 360°. If S2 is positive in value, $\theta_S$ is equal to or greater than 0° and smaller than 90°, or is greater than 270° and smaller than or equal to 360°. If S2 is negative in value, $\theta_S$ is greater than 90° and smaller than 270°. The arithmetic circuit 15 determines $\theta_S$ in the range of 360°, using the equation (1) and based on the foregoing determination of the combination of positive and negative signs on S1 and S2.

Note that it is possible to determine $\theta_S$ not only when the second signal S2 differs from the first signal S1 in phase by ¼ the signal period T but also when the second signal S2 differs from the first signal S1 in phase by an odd number of times ¼ the signal period T.

Figure 9:
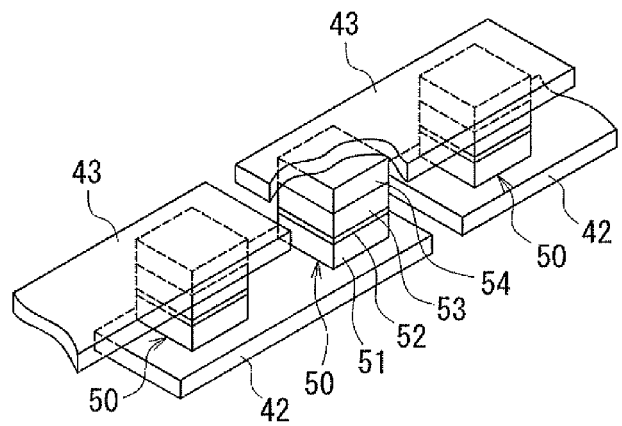
FIG. 9 is a perspective view showing part of an MR element in the magnetic sensor shown in FIG. 8.

An example of the configuration of the MR elements will now be described with reference to FIG. 9. FIG. 9 is a perspective view showing a part of an MR element in the magnetic sensor 5 shown in FIG. 8. In this example, the MR element has a plurality of lower electrodes, a plurality of MR films, and a plurality of upper electrodes. The plurality of lower electrodes 42 are arranged on a not-shown substrate. Each of the lower electrodes 42 has a long slender shape. Two lower electrodes 42 adjoining in the longitudinal direction of the lower electrodes 42 have a gap therebetween. As shown in FIG. 9, MR films 50 are provided on the top surfaces of the lower electrodes 42, near opposite ends in the longitudinal direction. Each of the MR films 50 includes a free layer 51, a nonmagnetic layer 52, a magnetization pinned layer 53, and an antiferromagnetic layer 54 that are stacked in this order, the free layer 51 being closest to the lower electrode 42. The free layer 51 is electrically connected to the lower electrode 42. The antiferromagnetic layer 54 is made of an antiferromagnetic material. The antiferromagnetic layer 54 is in exchange coupling with the magnetization pinned layer 53 so as to pin the magnetization direction of the magnetization pinned layer 53. The plurality of upper electrodes 43 are arranged over the plurality of MR films 50. Each of the upper electrodes 43 has a long slender shape, and establishes electrical connection between the respective antiferromagnetic layers 54 of two adjoining MR films 50 that are arranged on two lower electrodes 42 adjoining in the longitudinal direction of the lower electrodes 42. With such a configuration, the plurality of MR films 50 in the MR element shown in FIG. 9 are connected in series by the plurality of lower electrodes 42 and the plurality of upper electrodes 43. It should be appreciated that the layers 51 to 54 of the MR films 50 may be stacked in an order reverse to that shown in FIG. 9.

The operation and effects of the rotation angle sensor 1 will now be described. Based on the detection output from the magnetic sensor 5, the rotation angle sensor 1 detects the detection angle θs as the angle corresponding to the rotation angle θ of the magnet 2. As previously described, when the magnetic sensor 5 is located at the desired position, the magnetic field $H_S$ applied to the magnetic sensor 5 is equal to the magnetic field $H_0$, and accordingly, the detection angle θs is equal to the rotation angle θ. When the magnetic sensor 5 is located at a position offset from the desired position on the sensor mount surface due to a misalignment between the magnet 2 and the magnetic sensor 5, however, the direction of the magnetic field $H_S$ may be different from the direction of the magnetic field $H_0$. In such a case, the detection angle θs does not agree with the rotation angle θ, so that the angle error dθ results.

The rotation angle sensor 1 is required to have a small angle error dθ even in the event of a misalignment between the magnet 2 and the magnetic sensor 5. It is also required of the rotation angle sensor 1 that the magnetic field that is produced by the magnet 2 and applied to the magnetic sensor 5 be high in strength. This is for the sake of relatively reducing the effect of magnetic fields that can be applied to the magnetic sensor 5, except the magnetic field produced by the magnet 2. It is further required of the rotation angle sensor 1 that the distance between the magnet 2 and the magnetic sensor 5 is not excessively small so that the magnetic sensor 5 will not contact and damage the magnet 2. According to the embodiment, employing the magnet 2 having the plate-shaped portion 3 and the ring-shaped portion 4 makes it possible to increase the strength of the magnetic field that is produced by the magnet 2 and applied to the magnetic sensor 5 and to reduce the angle error dθ resulting from a misalignment between the magnet 2 and the magnetic sensor 5, without causing an excessive decrease in the distance between the magnet 2 and the magnetic sensor 5. This advantage will now be described in detail with reference to the results of several simulations.

Figure 10:
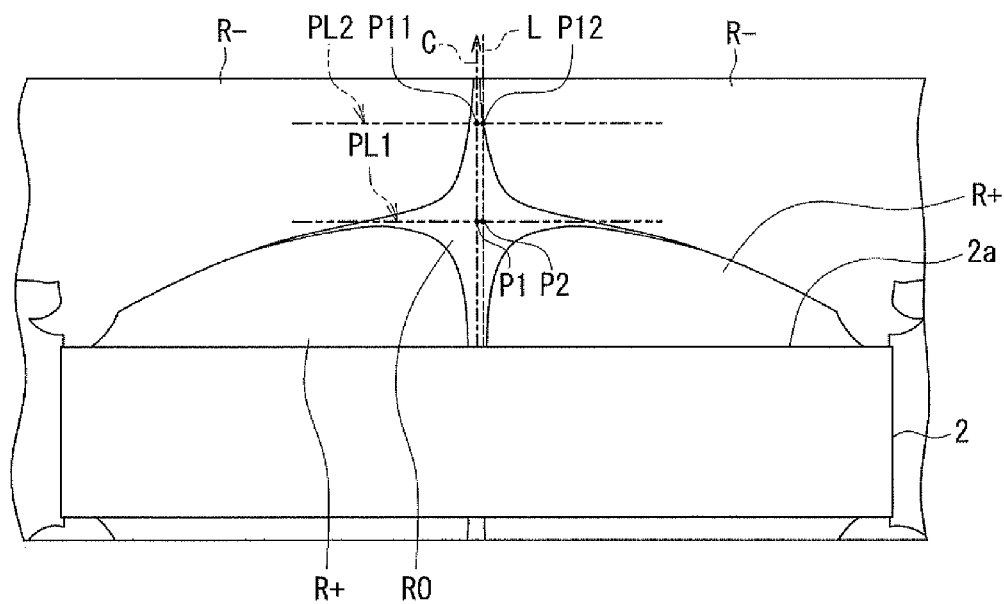
FIG. 10 is an explanatory diagram illustrating the magnetic field distribution around the magnet that was determined by a first simulation.
Figure 11:
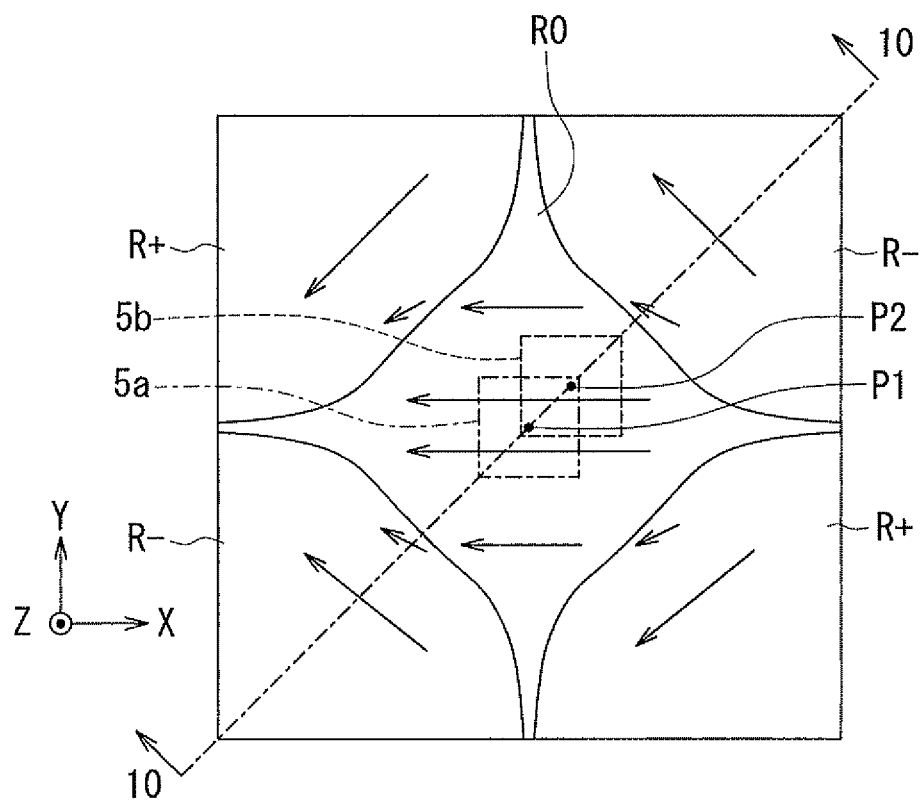
FIG. 11 is an explanatory diagram illustrating the magnetic field distribution in a virtual plane PL1 shown in FIG. 10.
Figure 12:
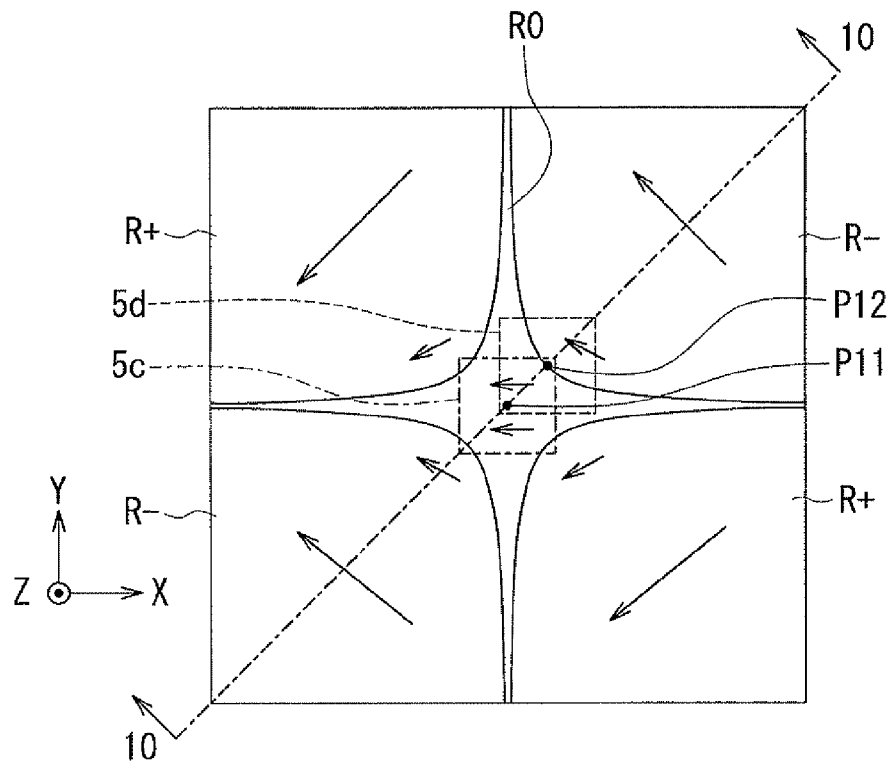
FIG. 12 is an explanatory diagram illustrating the magnetic field distribution in a virtual plane PL2 shown in FIG. 10.

First, a description will be given of the results of a first simulation that was carried out to investigate the magnetic field distribution around the magnet. In the first simulation, the finite element method (FEM) was employed to determine the magnetic field distribution around the magnet 2. FIG. 10 is an explanatory diagram illustrating the magnetic field distribution around the magnet 2 determined by the first simulation. FIG. 11 is an explanatory diagram illustrating the magnetic field distribution in a virtual plane PL1 shown in FIG. 10. FIG. 12 is an explanatory diagram illustrating the magnetic field distribution in a virtual plane PL2 shown in FIG. 10. FIG. 10 shows a cross section taken along line 10-10 in FIG. 11 and FIG. 12.

In FIG. 11 and FIG. 12, the arrows within the solid line frame indicate the directions of the magnetic field. In FIG. 10 to FIG. 12, the region denoted by symbol "R+" is representative of the region in which the angle error dθ has a positive value, whereas the region denoted by symbol "R−" is representative of the region in which the angle error dθ has a negative value. The region denoted by symbol "R0" is representative of the region in which the angle error dθ is substantially zero, that is, the region in which the direction of the magnetic field $H_S$ forms a substantially zero angle with respect to the direction of the magnetic field $H_0$. The region R0 will hereinafter be referred to as the parallel field region. As used herein, the expressions "the angle error dθ is substantially zero" and "the direction of the magnetic field $H_S$ forms a substantially zero angle with respect to the direction of the magnetic field $H_0$" include not only the situation where the angle error dθ (the angle that the direction of the magnetic field $H_S$ forms with respect to the direction of the magnetic field $H_0$) is zero but also a situation where the angle error dθ falls within a tolerance for the rotation angle sensor 1. Note that in FIG. 10 to FIG. 12, for the sake of convenience, the boundary between adjacent regions is shown by a line. In practice, however, the angle error dθ does not vary discontinuously from this line onward, but varies continuously as the position varies, albeit abruptly, in the vicinity of the line.

FIG. 10 to FIG. 12 show that there exists the parallel field region R0 in the vicinity of the end face 2a of the magnet 2, and the area of the parallel field region R0 on a virtual plane parallel to the end face 2a varies depending on the distance between the end face 2a and the virtual plane. The virtual planes PL1 and PL2 are both a virtual plane parallel to the end face 2a, and are at mutually different distances from the end face 2a. The virtual plane PL1 is one of a plurality of virtual planes that can be obtained by varying the distance from the end face 2a, and is the plane on which the parallel field region R0 has the maximum or almost maximum area. The parallel field region R0 has a smaller area on the virtual plane PL2 than on the virtual plane PL1.

In the embodiment, the distance between the virtual plane PL1 and the end face 2a will be referred to as the optimum distance. Now, how to determine the optimum distance, that is, how to determine the position of the virtual plane PL1, will be described with reference to FIG. 13. First, as shown in FIG. 10, assume a virtual straight line L that is parallel to the rotation axis C. The distance between the rotation axis C and the straight line L shall be, for example, about the maximum value of the amount of an anticipated misalignment between the magnet 2 and the magnetic sensor 5, and within the range of 0% to 10% of the diameter d1 of the magnet 2. In the example shown in FIG. 10, the diameter d1 of the magnet 2 is 15 mm, and the distance between the rotation axis C and the straight line L is 0.3 mm, which is 2% of the diameter d1. In FIG. 10 and FIG. 11, point P1 indicates the position at which the rotation axis C intersects the virtual plane PL1, while point P2 indicates the position at which the straight line L intersects the virtual plane PL1. In FIG. 10 and FIG. 12, point P11 indicates the position at which the rotation axis C intersects the virtual plane PL2, while point P12 indicates the position at which the straight line L intersects the virtual plane PL2.

Figure 13:
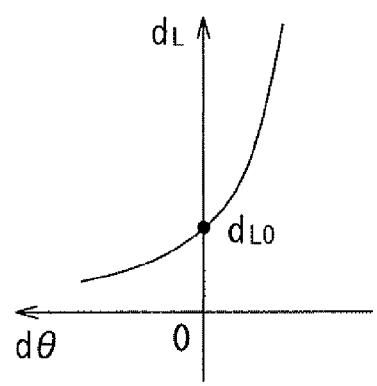
FIG. 13 is a characteristic chart illustrating the relationship between the distance from the end face of the magnet along a virtual straight line L shown in FIG. 10 and the angle error.

In determining the optimum distance, the relationship between the distance $d_L$ from the end face 2a on the straight line L and the angle error dθ is then determined. Note that the angle error dθ is assumed to be the angle that the direction of the magnetic field on a point on the straight line L determined by simulation forms with respect to the direction of the magnetic field $H_0$. FIG. 13 shows the relationship between the distance $d_L$ and the angle error dθ. In FIG. 13, the horizontal axis represents the angle error dθ, and the vertical axis represents the distance $d_L$. In FIG. 13, the region on the left to the vertical axis is representative of the region in which the angle error dθ has a positive value, whereas the region on the right to the vertical axis is representative of the region in which the angle error dθ has a negative value. In the example shown in FIG. 13, the angle error dθ varies from a positive value to a negative value as the distance $d_L$ increases. Next, from the relationship shown in FIG. 13, a distance $d_L$ that makes the angle error dθ zero is determined and defined as the optimum distance $d_{LO}$. Note that depending on the position of the virtual straight line L, conversely to FIG. 13, the angle error dθ may vary from a negative value to a positive value as the distance $d_L$ increases. In this case also, a distance $d_L$ that makes the angle error dθ zero can be determined and defined as the optimum distance $d_{L0}$.

To reduce the angle error dθ resulting from a misalignment between the magnet 2 and the magnetic sensor 5, it is preferable that the magnetic sensor 5 be located on the virtual plane PL1. This will be described below. In FIG. 11, the frame shown by a broken line denoted with symbol 5a indicates the magnetic sensor 5 positioned so that the position P1 and the center of the magnetic sensor 5 are aligned with each other on the virtual plane PL1. The frame shown by the broken line with symbol 5a can be said to be the desired position of the magnetic sensor 5 on the virtual plane PL1. In FIG. 11, the frame shown by a broken line denoted with symbol 5b indicates the magnetic sensor 5 positioned so that the position P2 and the center of the magnetic sensor 5 are aligned with each other on the virtual plane PL1, that is, the magnetic sensor 5 located at a position offset from the desired position. In FIG. 12, the frame shown by a broken line denoted with symbol 5c indicates the magnetic sensor 5 positioned so that the position P11 and the center of the magnetic sensor 5 are aligned with each other on the virtual plane PL2. The frame shown by the broken line with symbol 5c can be said to be the desired position of the magnetic sensor 5 on the virtual plane PL2. In FIG. 12, the frame shown by a broken line denoted with symbol 5d indicates the magnetic sensor 5 positioned so that the position P12 and the center of the magnetic sensor 5 are aligned with each other on the virtual plane PL2, that is, the magnetic sensor 5 located at a position offset from the desired position.

As shown in FIG. 11, on the virtual plane PL1, the parallel field region R0 is wide, so that the frame denoted by symbol 5a (the magnetic sensor 5) and the frame denoted by symbol 5b (the magnetic sensor 5) are both within the parallel field region R0. Accordingly, when the magnetic sensor 5 is located on the virtual plane PL1, the angle error dθ is zero regardless of whether the magnetic sensor 5 is at the desired position denoted by symbol 5a or at the offset position denoted by symbol 5b.

In contrast to this, as shown in FIG. 12, on the virtual plane PL2 the parallel field region R0 is narrow, so that while the frame denoted by symbol 5c (the magnetic sensor 5) is mostly within the parallel field region R0, a large extent of the frame denoted by symbol 5d (the magnetic sensor 5) is outside the parallel field region R0. Accordingly, when the magnetic sensor 5 is located on the virtual plane PL2, the angle error dθ is zero if the magnetic sensor 5 is at the desired position denoted by symbol 5c. However, if the magnetic sensor 5 is at the offset position denoted by symbol 5d, the angle error dθ has a large absolute value.

As can be seen from the descriptions above, locating the magnetic sensor 5 on the virtual plane PL1 allows reducing the angle error dθ resulting from a misalignment between the magnet 2 and the magnetic sensor 5. It is therefore preferable to locate the magnetic sensor 5 on the virtual plane PL1. On the virtual plane PL1, the magnetic field produced by the magnet 2 is in directions parallel to each other at positions P1 and P2. The position P1 is the position at which the rotation axis C intersects the virtual plane PL1, and the position P2 is different from the position P1. Accordingly, the virtual plane PL1 corresponds to the "virtual plane that is parallel to the end face of the magnet and apart from the end face by a distance equal to the distance between the end face and the magnetic sensor" according to the invention. The position P1 corresponds to the first position according to the invention, while the position P2 corresponds to the second position according to the invention.

Note that the regions R0, R+, and R− exist not only in the vicinity of the end face of the magnet 2 of the embodiment but also in the vicinity of the end face of a cylindrical magnet or a ring-shaped magnet that will be described later as magnets of comparative examples. However, the distribution of the regions R0, R+, and R− varies depending on the shape of the magnet. The magnetic field $H_0$, the magnetic field $H_S$, the angle error dθ, and the optimum distance $d_{L0}$ described above will also be employed for the magnets of the comparative examples.

Now, a description will be given the results of a second simulation in which a magnet of a first comparative example was used to investigate the relationship between the thickness of the magnet and the optimum distance $d_{L0}$. The magnet of the first comparative example is a cylindrical NdFeB bonded magnet having the same shape as that of the plate-shaped portion 3 of the magnet 2. In the second simulation, the diameter and the thickness of the magnet of the first comparative example were varied to determine the optimum distance $d_{L0}$. The other conditions for the second simulation were the same as those for the first simulation.

Figure 14:
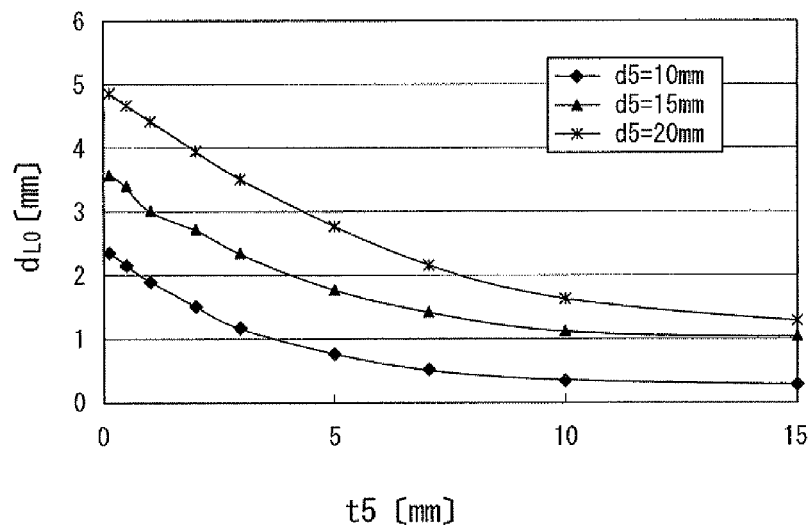
FIG. 14 is a characteristic chart illustrating the relationship between the thickness of the magnet and the optimum distance, determined by a second simulation.

FIG. 14 is a characteristic chart illustrating the relationship between the thickness of the magnet of the first comparative example and the optimum distance $d_{L0}$, determined by the second simulation. In FIG. 14, the diameter of the magnet of the first comparative example is represented by symbol d5, while the thickness of the magnet of the first comparative example is represented by symbol t5. In FIG. 14, the horizontal axis represents the thickness t5, and the vertical axis represents the optimum distance $d_{L0}$. FIG. 14 shows that the optimum distance $d_{L0}$ is reduced as the thickness t5 increases. It is also shown that the optimum distance $d_{L0}$ is reduced as the diameter d5 decreases.

Next, a description will be given of the results of a third simulation in which the relationship between the distance between the magnet and the magnetic sensor 5 and the strength of the magnetic field $H_S$ applied to the magnetic sensor 5 was investigated on a magnet 2 of a practical example and magnets of second to fourth comparative examples. The magnet 2 of the practical example is one of examples of the magnet 2 of the embodiment. Each magnet used in the third simulation was an NdFeB bonded magnet. The magnet 2 of the practical example is shaped as follows. The diameter d1 of the magnet 2 is 15 mm, and the diameter d2 of the hollow 4a (the inner diameter of the ring-shaped portion 4) is 4 mm. The thickness t2 of the magnet 2, the thickness t3 of the plate-shaped portion 3, and the thickness t4 of the ring-shaped portion 4 are 6 mm, 3 mm, and 3 mm, respectively.

The magnets of the second and third comparative examples are cylindrical NdFeB bonded magnets each having the same shape as that of the plate-shaped portion 3 of the magnet 2. The magnet of the fourth comparative example is an NdFeB bonded magnet having the same shape as that of the ring-shaped portion 4 of the magnet 2. The magnets of the second to fourth comparative examples are all 15 mm in diameter. The diameter of the hollow of the magnet (the inner diameter of the magnet) of the fourth comparative example is 4 mm. The magnet of the second comparative example is 3 mm in thickness. The magnets of the third and fourth comparative examples are all 6 mm in thickness.

In the third simulation, for each magnet, the distance $d_G$ between the end face of the magnet and the magnetic sensor 5 was varied to determine the strength of the magnetic field $H_S$ applied to the magnetic sensor 5 and the angle error dθ. Note that the strength of the magnetic field $H_S$ was assumed to be the strength of the magnetic field $H_0$ at a position on the rotation axis C that was apart from the end face of the magnet by the distance $d_G$. The angle error $d\theta$ was assumed to be the angle that the direction of the magnetic field on the virtual straight line L forms with respect to the direction of the magnetic field $H_0$ on a virtual plane that is parallel to the end face of the magnet and apart from the end face by the distance $d_G$. The other conditions for the third simulation were the same as those for the first simulation.

Figure 15:
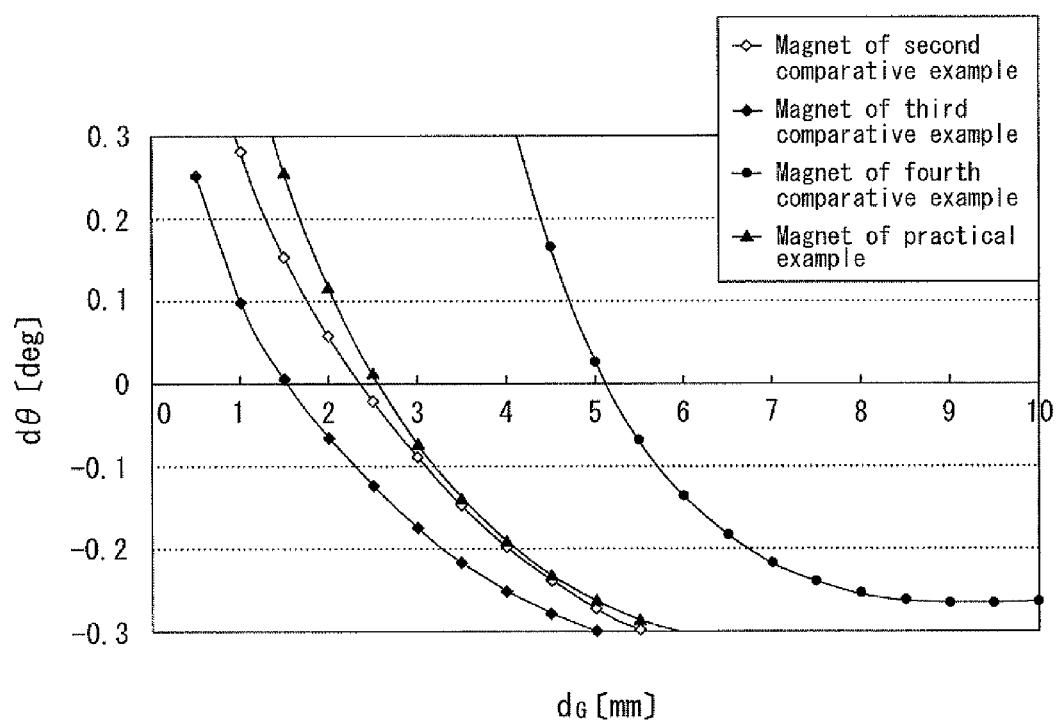
FIG. 15 is a characteristic chart illustrating the relationship between the distance between the magnet and the magnetic sensor and the angle error, determined by a third simulation.
Figure 16:
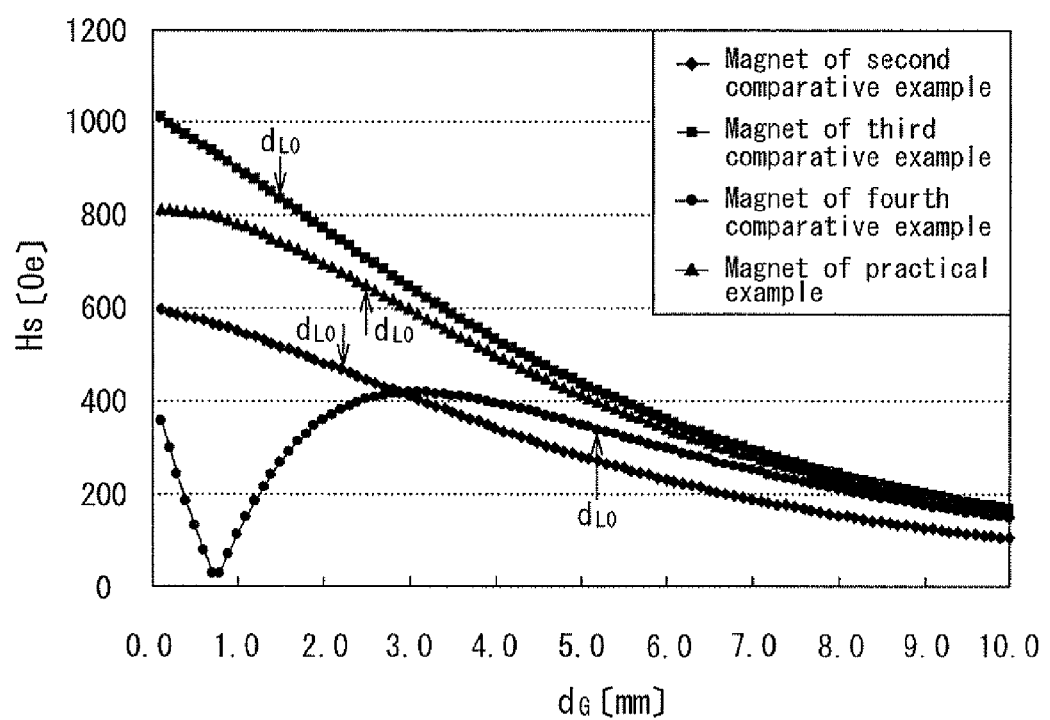
FIG. 16 is a characteristic chart illustrating the relationship between the distance between the magnet and the magnetic sensor and the strength of the magnetic field applied to the magnetic sensor, determined by the third simulation.

FIG. 15 is a characteristic chart illustrating the relationship between the distance $d_G$ and the angle error $d\theta$ determined by the third simulation. FIG. 16 is a characteristic chart illustrating the relationship between the distance $d_G$ and the strength of the magnetic field $H_S$ applied to the magnetic sensor 5, determined by the third simulation. In FIG. 15, the horizontal axis represents the distance $d_G$ and the vertical axis represents the angle error $d\theta$. In FIG. 16, the horizontal axis represents the distance $d_G$ and the vertical axis represents the strength of the magnetic field $H_S$. The unit of the strength of the magnetic field $H_S$ is Oe (1 Oe=79.6 A/m).

Referring to FIG. 15, the distance do at which the angle error $d\theta$ is zero is the optimum distance $d_{L0}$. The optimum distance $d_{L0}$ is: approximately 2.5 mm for the magnet 2 of the practical example; approximately 2.3 mm for the magnet of the second comparative example; approximately 1.5 mm for the magnet of the third comparative example; and approximately 5.1 mm for the magnet of the fourth comparative example.

A comparison between the magnet 2 of the practical example and the magnet of the second comparative example shows the following. As shown in FIG. 15, the optimum distance $d_{L0}$ for the magnet 2 of the practical example and that for the magnet of the second comparative example are almost equal. However, as shown in FIG. 16, the strength of the magnetic field $H_S$ at the optimum distance $d_{L0}$ is higher for the magnet 2 of the practical example than for the magnet of the second comparative example. The optimum distance $d_{L0}$ is a distance between the end face of the magnet and the magnetic sensor 5 that allows reducing the angle error $d\theta$ resulting from a misalignment between the magnet and the magnetic sensor 5. It is thus seen that the magnet 2 of the embodiment is capable of increasing the strength of the magnetic field $H_S$, when compared with a cylindrical magnet (the magnet of the second comparative example) under the condition under which the optimum distance $d_{L0}$, i.e., a distance between the end face of the magnet and the magnetic sensor 5 that allows reducing the angle error $d\theta$ resulting from a misalignment between the magnet and the magnetic sensor 5, is almost the same for the two magnets.

A comparison between the magnet of the second comparative example and the magnet of the third comparative example shows that in the case of using a cylindrical magnet, an increase in the thickness of the magnet increases the strength of the magnetic field $H_S$ at the optimum distance $d_{L0}$ but reduces the optimum distance $d_{L0}$. Accordingly, in the case of using a cylindrical magnet, varying the thickness of the magnet in an attempt to increase the strength of the magnetic field at the optimum distance $d_{L0}$ and reduce the angle error $d\theta$ resulting from a misalignment between the magnet and the magnetic sensor 5 will result in an excessive decrease in the distance between the magnet and the magnetic sensor 5.

Furthermore, a comparison between the magnet of the third comparative example and the magnet of the fourth comparative example shows that a ring-shaped magnet (the magnet of the fourth comparative example) can increase the optimum distance $d_{L0}$. In the case of using a ring-shaped magnet (the magnet of the fourth comparative example), however, the strength of the magnetic field $H_S$ at the optimum distance $d_{L0}$ is significantly low.

The foregoing discussions show that the magnet 2 of the embodiment makes it possible to increase the strength of the magnetic field that is produced by the magnet 2 and applied to the magnetic sensor 5 and to reduce the angle error $d\theta$ resulting from a misalignment between the magnet 2 and the magnetic sensor 5, without causing an excessive decrease in the distance between the magnet 2 and the magnetic sensor 5. This advantage cannot be obtained with a cylindrical or ring-shaped magnet.

Now, a description will be given of the results of a fourth simulation in which the relationship between the optimum distance $d_{L0}$ and the strength of the magnetic field $H_S$ at the optimum distance $d_{L0}$ was investigated on the magnet 2 of the practical example. The magnet 2 of the practical example for the fourth simulation is shaped as follows. The diameter d1 of the magnet 2 is 15 mm, and the diameter d2 of the hollow 4a (the inner diameter of the ring-shaped portion 4) is 4 mm. The thickness t2 of the magnet 2 is 3 mm. In the fourth simulation, t4/t2 or the ratio of the thickness t4 of the ring-shaped portion 4 to the thickness t2 of the magnet 2 (hereinafter referred to as the ring-shaped portion thickness ratio) was varied in the range of 0% to 100% to determine the optimum distance $d_{L0}$ and the strength of the magnetic field $H_S$ at the optimum distance $d_{L0}$. The other conditions for the fourth simulation were the same as those for the third simulation. Note that a magnet of a 0% ring-shaped portion thickness ratio is a cylindrical magnet, whereas a magnet of a 100% ring-shaped portion thickness ratio is a ring-shaped magnet. Although a magnet 2 of a 0% ring-shaped portion thickness ratio and a magnet 2 of a 100% ring-shaped portion thickness ratio are excluded from the magnet 2 of the embodiment, they are included in the magnet 2 of the practical example for the sake of convenience.

Figure 17:
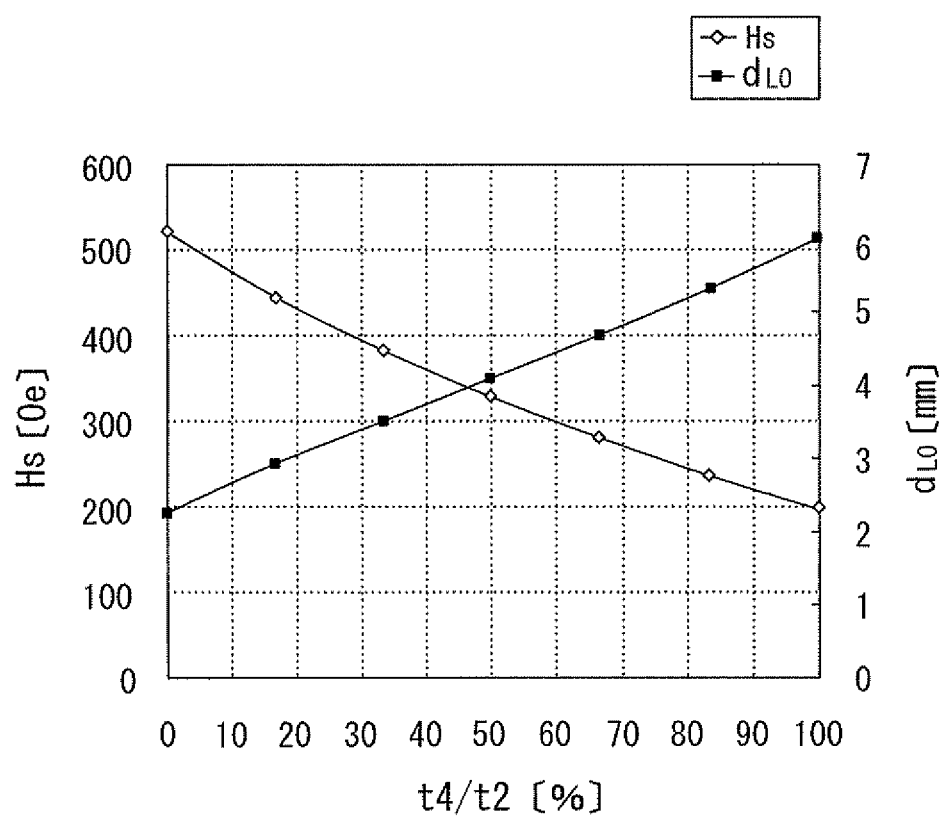
FIG. 17 is a characteristic chart illustrating the relationship between the ratio of thickness of the ring-shaped portion of the magnet, the optimum distance, and the strength of the magnetic field at the optimum distance, determined by a fourth simulation.

FIG. 17 is a characteristic chart illustrating the relationship between the ring-shaped portion thickness ratio t4/t2 of the magnet 2, the optimum distance $d_{L0}$, and the strength of the magnetic field $H_S$ at the optimum distance $d_{L0}$, determined by the fourth simulation. In FIG. 17, the horizontal axis represents the ring-shaped portion thickness ratio t4/t2, while the vertical axis on the left represents the strength of the magnetic field $H_S$ at the optimum distance $d_{L0}$ and the vertical axis on the right represents the optimum distance $d_{L0}$. FIG. 17 shows that the optimum distance $d_{L0}$ increases as a linear function of the ring-shaped portion thickness ratio t4/t2 when the ring-shaped portion thickness ratio t4/t2 increases. FIG. 17 also shows that the strength of the magnetic field $H_S$ at the optimum distance $d_{L0}$ decreases as a linear function of the ring-shaped portion thickness ratio t4/t2 when the ring-shaped portion thickness ratio t4/t2 increases. As can be seen from these facts, it is possible according to the embodiment to adjust the optimum distance $d_{L0}$ and the strength of the magnetic field $H_S$ by adjusting the ring-shaped portion thickness ratio.

If comparison is made with reference to FIG. 15 and FIG. 16 between the magnet of the second comparative example and the magnet of the third comparative example used in the third simulation, it can be seen that in the case of using a cylindrical magnet, reducing the thickness of the magnet in an attempt to increase the optimum distance $d_{L0}$ causes the strength of the magnetic field $H_S$ at the optimum distance $d_{L0}$ to be excessively reduced as compared with the case of using the magnet 2 of the embodiment.

As previously mentioned, a magnet having a 0% ring-shaped portion thickness ratio and a magnet having a 100% ring-shaped portion thickness ratio are excluded from the magnet 2 of the embodiment. In the embodiment, as shown in FIG. 17, in terms of the optimum distance $d_{L0}$ and the strength of the magnetic field $H_S$ at the optimum distance $d_{LO}$, the magnet 2 having a ring-shaped portion thickness ratio higher than 0% and lower than 100% has a property different from that of the magnets of 0% and 100% ring-shaped portion thickness ratios. Accordingly, the ring-shaped portion thickness ratio of the magnet 2 of the embodiment need only be higher than 0% and lower than 100%. However, to clearly distinguish the magnet 2 of the embodiment from a magnet having a 0% or 100% ring-shaped portion thickness ratio, that is, a cylindrical or ring-shaped magnet, the ring-shaped portion thickness ratio of the magnet 2 of the embodiment preferably falls within the range of 5% to 95%.

Now, a description will be given of the results of a fifth simulation in which the relationship between the shape of the magnet, the optimum distance $d_{LO}$, and the strength of the magnetic field $H_S$ at the optimum distance $d_{LO}$ was investigated on the magnet 2 of the practical example and magnets of fifth to seventh comparative examples. The magnet 2 of the practical example for the fifth simulation is shaped as follows. The diameter d1 of the magnet 2 is 15 mm. The thickness t2 of the magnet 2, the thickness t3 of the plate-shaped portion 3, and the thickness t4 of the ring-shaped portion 4 are 3 mm, 1.5 mm, and 1.5 mm, respectively. The magnets of the fifth to seventh comparative examples are cylindrical magnets each having the same shape as that of the plate-shaped portion 3 of the magnet 2, and their diameters are 10 mm, 15 mm, and 20 mm, respectively.

In the fifth simulation, the ratio of the diameter d2 of the hollow 4a (the inner diameter of the ring-shaped portion 4) to the diameter d1 of the magnet 2 (hereinafter referred to as the hollow portion inner diameter ratio) was varied in the range of 0% to 100% to determine the optimum distance $d_{LO}$ and the strength of the magnetic field $H_S$ at the optimum distance $d_{LO}$. In the fifth simulation, the thicknesses of the magnets of the fifth to seventh comparative examples were also varied to determine the optimum distance $d_{LO}$ and the strength of the magnetic field $H_S$ at the optimum distance $d_{LO}$ for each of the magnets of the fifth to seventh comparative examples. The other conditions for the fifth simulation were the same as those for the third simulation.

Figure 18:
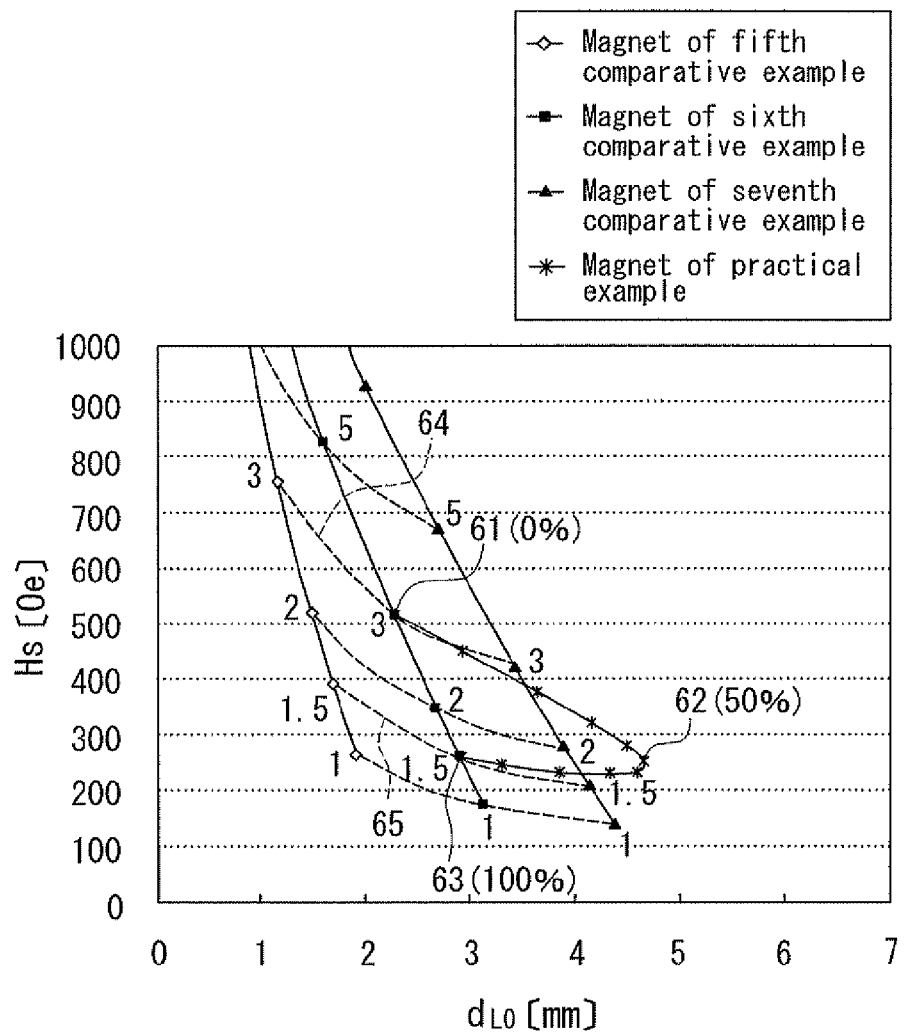
FIG. 18 is a characteristic chart illustrating the relationship between the shape of the magnet, the optimum distance, and the strength of the magnetic field at the optimum distance, determined by a fifth simulation.

FIG. 18 is a characteristic chart illustrating the relationship between the shape of the magnet, the optimum distance $d_{LO}$, and the strength of the magnetic field $H_S$ at the optimum distance $d_{LO}$, determined by the fifth simulation. In FIG. 18, the horizontal axis represents the optimum distance $d_{LO}$ and the vertical axis represents the strength of the magnetic field $H_S$ at the optimum distance $d_{LO}$. The numerical values given in the vicinity of respective points in FIG. 18 are indicative of the thickness of the magnet (in mm). Symbol 61 represents a point at which the hollow portion inner diameter ratio is 0%; symbol 62 represents a point at which the hollow portion inner diameter ratio is 50%; and symbol 63 represents a point at which the hollow portion inner diameter ratio is 100%. The four points between the points of 0% and 50% hollow portion inner diameter ratios are the points of 10%, 20%, 30%, and 40% hollow portion inner diameter ratios, respectively, which are listed in order of closeness to the point of 0%. On the other hand, the four points between the points of 50% and 100% hollow portion inner diameter ratios are the points of 60%, 70%, 80%, and 90% hollow portion inner diameter ratios, respectively, which are listed in order of closeness to the point of 50%. In FIG. 18, a plurality of broken curved lines are indicative of the properties of cylindrical magnets determined with their diameters varied and their thicknesses kept constant. In particular, the broken curved line denoted by symbol 64 is indicative of the property of a 3-mm-thick cylindrical magnet determined with its diameter varied. The broken curved line denoted by symbol 65 is indicative of the property of a 1.5-mm-thick cylindrical magnet determined with its diameter varied.

A magnet 2 of a 0% hollow portion inner diameter ratio is a cylindrical magnet having a thickness of 3 mm and is the same as the magnet of the sixth comparative example having a thickness of 3 mm. A magnet 2 of a 100% hollow portion inner diameter ratio is a cylindrical magnet having a thickness of 1.5 mm and is the same as the magnet of the sixth comparative example having a thickness of 1.5 mm. The magnets 2 of 0% and 100% hollow portion inner diameter ratios are excluded from the magnet 2 of the embodiment, but they are included in the magnet 2 of the practical example for the sake of convenience.

As shown in FIG. 18, it is possible according to the embodiment to adjust the optimum distance $d_{LO}$ and the strength of the magnetic field $H_S$ by adjusting the hollow portion inner diameter ratio. Now, a description will be given of the advantageous effects of the embodiment that are deduced from the results of the fifth simulation shown in FIG. 18.

First, the magnet 2 of the practical example and the magnet of the sixth comparative example that are of the same diameter are compared under the condition under which the optimum distance $d_{LO}$ is the same for the two magnets. From FIG. 18, it can be seen that the strength of the magnetic field $H_S$ at the optimum distance $d_{LO}$ is higher for the magnet 2 of the practical example than for the magnet of the sixth comparative example except when the hollow portion inner diameter ratio of the magnet 2 is 0% and 100%. Thus, the magnet 2 of the embodiment is capable of increasing the strength of the magnetic field $H_S$ when compared with a cylindrical magnet (the magnet of the sixth comparative example) under the condition under which the optimum distance $d_{LO}$, i.e., a distance between the end face of the magnet and the magnetic sensor 5 that allows reducing the angle error dθ resulting from a misalignment between the magnet and the magnetic sensor 5, is almost the same for the two magnets.

Next, the magnet 2 of the practical example and the magnet of the sixth comparative example are compared under the condition under which the strength of the magnetic field $H_S$ at the optimum distance $d_{LO}$ is the same for the two magnets. From FIG. 18, it can be seen that the optimum distance $d_{LO}$ is greater for the magnet 2 of the practical example than for the magnet of the sixth comparative example except when the hollow portion inner diameter ratio of the magnet 2 is 0% and 100%. Thus, the magnet 2 of the embodiment is capable of increasing the optimum distance $d_{LO}$, i.e., a distance between the end face of the magnet and the magnetic sensor 5 that allows reducing the angle error dθ resulting from a misalignment between the magnet and the magnetic sensor 5, when compared with a cylindrical magnet (the magnet of the sixth comparative example) under the condition under which the strength of the magnetic field $H_S$ is almost the same for the two magnets.

From the foregoing, it can be seen that according to the embodiment, it is possible to increase the strength of the magnetic field $H_S$ and reduce the angle error dθ resulting from a misalignment between the magnet 2 and the magnetic sensor 5, without causing an excessive decrease in the distance between the magnet 2 and the magnetic sensor 5.

As previously mentioned, a magnet having a 0% hollow portion inner diameter ratio and a magnet having a 100% hollow portion inner diameter ratio are excluded from the magnet 2 of the embodiment. In the embodiment, as shown in FIG. 18, the magnet 2 is advantageous over a cylindrical magnet in terms of the optimum distance $d_{LO}$ and the strength of the magnetic field $H_S$ at the optimum distance $d_{LO}$ when the magnet 2 has a hollow portion inner diameter ratio higher than 0% and lower than 100%. Accordingly, the hollow portion inner diameter ratio of the magnet 2 of the embodiment need only be higher than 0% and lower than 100%. However, to clearly distinguish the magnet 2 of the embodiment from a magnet having a 0% or 100% hollow portion inner diameter ratio, that is, a cylindrical magnet, the hollow portion inner diameter ratio of the magnet 2 of the embodiment preferably falls within the range of 5% to 95%.

Referring to the curved line indicative of the property of the magnet 2 of the practical example shown in FIG. 18, when the hollow portion inner diameter ratio of the magnet 2 falls within the range of from more than 0% to no more than 50%, in particular, the following effects are exerted noticeably. That is, when the hollow portion inner diameter ratio is within this range, the effect that a greater optimum distance $d_{LO}$ is achieved and the effect that a higher strength of the magnetic field $H_S$ is achieved at the optimum distance $d_{LO}$ are both exerted more noticeably when compared with the case of increasing the optimum distance $d_{LO}$ by reducing the thickness of the magnet of the sixth comparative example from 3 mm to 1.5 mm. Accordingly, when these noticeable effects are desired, the hollow portion inner diameter ratio preferably falls within the range of from more than 0% to no more than 50%, more preferably within the range of 5% to 50%.

Furthermore, referring to the curved line indicative of the property of the magnet 2 of the practical example shown in FIG. 18, when the hollow portion inner diameter ratio of the magnet 2 falls within the range of from more than 50% to no more than 100%, it is possible to increase the optimum distance $d_{LO}$ by reducing the hollow portion inner diameter ratio, without causing a great change in the strength of the magnetic field $H_S$ at the optimum distance $d_{LO}$. Accordingly, when it is desired to adjust the optimum distance $d_{LO}$ without causing a great change in the strength of the magnetic field $H_S$ at the optimum distance $d_{LO}$, the hollow portion inner diameter ratio preferably falls within the range of from more than 50% to no more than 100%, more preferably within the range of from more than 50% to no more than 95%.

The aforementioned tendency derived from the results of the fifth simulation does not depend on the ring-shaped portion thickness ratio.

As has been described with reference to the results of the first to fifth simulations, it is possible according to the embodiment to increase the strength of the magnetic field $H_S$ and reduce the angle error dθ resulting from a misalignment between the magnet 2 and the magnetic sensor 5, without causing an excessive decrease in the distance between the magnet 2 and the magnetic sensor 5.

In FIG. 18, the plurality of broken curved lines show that, for a cylindrical magnet, increasing the diameter of the magnet allows increasing the optimum distance $d_{LO}$ without significantly reducing the strength of the magnetic field $H_S$ at the optimum distance $d_{LO}$. In the case of the cylindrical magnet, however, an increase in the diameter of the magnet increases the volume of the magnet, and consequently increases the cost of the magnet when compared with the case of the magnet 2 of the embodiment. This will now be described with reference to a specific example. Here, with reference to FIG. 18, a comparison will be made between the magnet of the seventh comparative example having a diameter of 20 mm and a thickness of 2.8 mm and the magnet 2 of the practical example having a hollow portion inner diameter ratio of 15%. These two magnets provide almost the same optimum distance $d_{LO}$, and almost the same strength of the magnetic field $H_S$ at the optimum distance $d_{LO}$. However, the magnet of the seventh comparative example having the aforementioned dimensions is 880 mm$^3$ in volume, whereas the magnet 2 having a 15% hollow portion inner diameter ratio is 524 mm$^3$ in volume. As such, according to the embodiment, the magnet 2 is smaller in volume and thus lower in cost, when compared with a cylindrical magnet under the condition under which the optimum distance $d_{LO}$ is almost the same and the strength of the magnetic field $H_S$ at the optimum distance $d_{LO}$ is almost the same for the two magnets.

Now, a description will be given of the results of a sixth simulation in which the relationship between the distance between the magnet 2 and the magnetic sensor 5 and the strength of the magnetic field $H_S$ applied to the magnetic sensor 5 was investigated on the magnet 2 of the embodiment. In the sixth simulation, employed were a first magnet 2 and a second magnet 2 that were capable of providing the same optimum distance $d_{LO}$. These two magnets are 15 mm in diameter d1, and 3 mm in thickness t2. In the first magnet 2, the diameter d2 of the hollow 4a (the inner diameter of the ring-shaped portion 4) is 4 mm, and the thickness t4 of the ring-shaped portion 4 is 1.5 mm. In the second magnet 2, the diameter d2 of the hollow 4a (the inner diameter of the ring-shaped portion 4) is 7 mm, and the thickness t4 of the ring-shaped portion 4 is 1 mm. The first magnet 2 has a volume of 511 mm$^3$, whereas the second magnet 2 has a volume of 492 mm$^3$. In the sixth simulation, for each of the first and second magnets 2, the distance $d_G$ between the end face 2a of the magnet 2 and the magnetic sensor 5 was varied to determine the strength of the magnetic field $H_S$ and the angle error dθ. Note that the definitions of the strength of the magnetic field $H_S$ and the angle error dθ used in the sixth simulation are the same as those used in the third simulation, which have been already described. The other conditions for the sixth simulation were the same as those for the third simulation.

Figure 19:
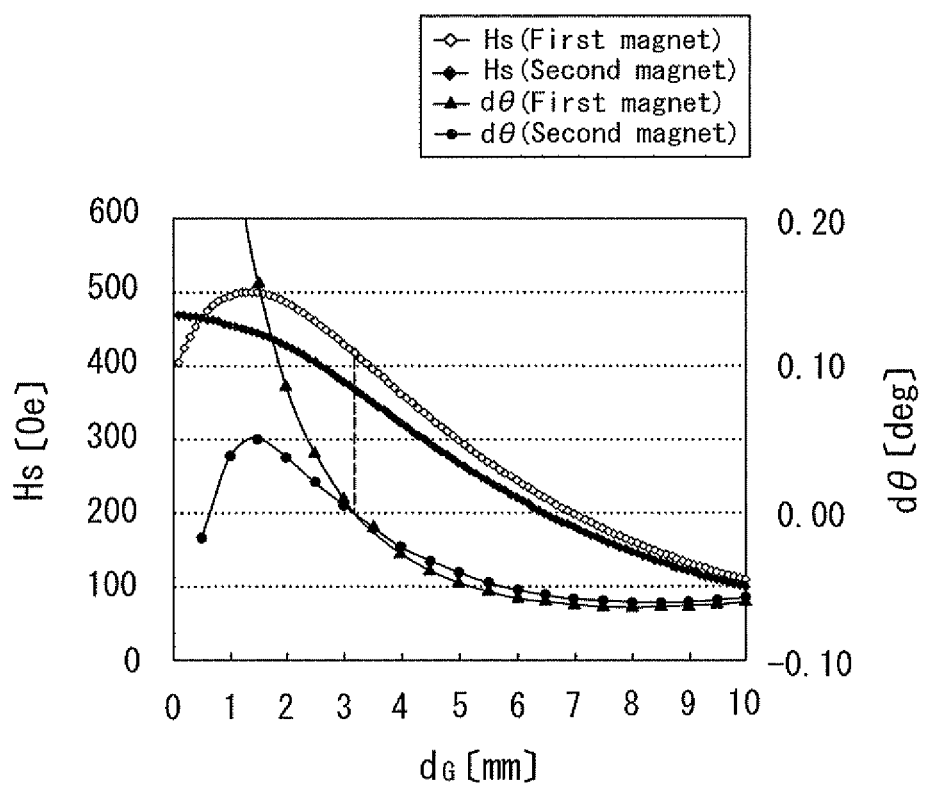
FIG. 19 is a characteristic chart illustrating the relationship between the distance between the magnet and the magnetic sensor, the strength of the magnetic field applied to the magnetic sensor, and the angle error, determined by a sixth simulation.

FIG. 19 is a characteristic chart illustrating the relationship between the distance $d_G$ between the magnet 2 and the magnetic sensor 5, the strength of the magnetic field $H_S$ applied to the magnetic sensor 5, and the angle error dθ, determined by the sixth simulation. In FIG. 19, the horizontal axis represents the distance $d_G$, while the vertical axis on the left represents the strength of the magnetic field $H_S$ and the vertical axis on the right represents the angle error dθ. The broken straight line in FIG. 19 indicates the distance $d_G$ at which the angle error dθ of the first and second magnets 2 is zero, that is, the optimum distance $d_{LO}$. As shown in FIG. 19, the strength of the magnetic field $H_S$ at the optimum distance $d_{LO}$ is higher for the first magnet 2 than for the second magnet 2. This is presumably because the second magnet 2 is greater in volume than the first magnet 2. As can be seen from these results, to obtain the same optimum distance $d_{LO}$ by varying the inner diameter d2 and the thickness t4 of the ring-shaped portion 4 with the diameter d1 and the thickness t2 of the magnet 2 held constant, a ring-shaped portion 4 that has a smaller inner diameter d2 and a greater thickness t4 is more advantageous in increasing the strength of the magnetic field $H_S$ at the optimum distance $d_{LO}$ than a ring-shaped portion 4 that has a greater inner diameter d2 and a smaller thickness t4.

The other effects of the embodiment will now be described. In the embodiment, the shape of any cross section of the magnet 2 including the rotation axis C is symmetric about the rotation axis C. According to the embodiment, employing the magnet 2 of such a shape serves to prevent the occurrence of an angle error attributable to the shape of the magnet 2. An exemplary magnet 2 that satisfies the aforementioned shape requirement is the magnet 2 that has been described so far, that is, the magnet 2 in which the plate-shaped portion 3 is shaped like a circular plate and the ring-shaped portion 4 has an outer periphery and an inner periphery that are both circular in any cross section of the ring-shaped portion 4 perpendicular to the rotation axis C. However, examples of the magnet 2 of the embodiment include magnets of various other shapes, such as those that will be described below as a plurality of modification examples. The magnets of the modification examples have a plate-shaped portion and a ring-shaped portion, wherein the plate-shaped portion does not include any hollow through which the rotation axis C passes, whereas the ring-shaped portion includes a hollow through which the rotation axis C passes. The shape of any cross section of the magnets of the modification examples including the rotation axis C is symmetric about the rotation axis C. The various advantageous effects that have been described so far are obtainable with such magnets, compared with the case of using a cylindrical magnet.

MODIFICATION EXAMPLES

Figure 20:
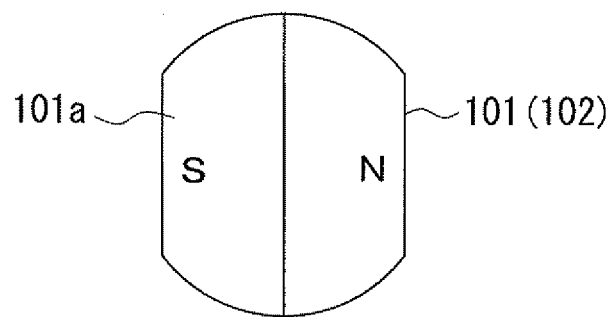
FIG. 20 is a plan view showing a first modification example of the magnet of the embodiment of the invention.
Figure 21:
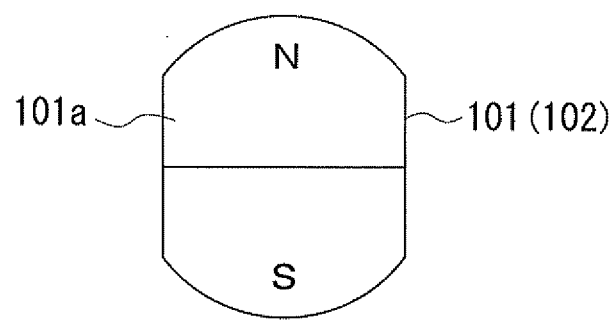
FIG. 21 is a plan view showing a second modification example of the magnet of the embodiment of the invention.

Reference is now made to FIG. 20 to FIG. 27 to describe first to eighth modification examples of the magnet 2 of the embodiment. FIG. 20 is a plan view showing the first modification example of the magnet 2. FIG. 21 is a plan view showing the second modification example of the magnet 2. Like the magnet 2 shown in FIG. 1 to FIG. 3, the magnet 101 of each of the first and second modification examples has an end face 101a perpendicular to the rotation axis C (not shown), and has a magnetization in a direction perpendicular to the rotation axis C. The magnet 101 includes a plate-shaped portion 102 including the end face 101a, and a ring-shaped portion (not shown) that is located on a side of the plate-shaped portion 102 farther from the end face 101a and coupled to the plate-shaped portion 102. The plate-shaped portion 102 is shaped like an elliptical plate that is elongated in the vertical direction in FIG. 20 or FIG. 21. The plate-shaped portion 102 does not include any hollow through which the rotation axis C passes. The ring-shaped portion includes an outer periphery and a hollow through which the rotation axis C passes. In any cross section of the ring-shaped portion perpendicular to the rotation axis C, the outer periphery of the ring-shaped portion has an elliptical shape the same as the shape of the outer periphery of the plate-shaped portion 102 in any cross section of the plate-shaped portion 102 perpendicular to the rotation axis C. The inner periphery of the ring-shaped portion may be either elliptical or circular in any cross section of the ring-shaped portion perpendicular to the rotation axis C.

The plate-shaped portion 102 of the first modification example has an N pole and an S pole that are arranged in the horizontal direction in FIG. 20. The plate-shaped portion 102 of the second modification example has an N pole and an S pole that are arranged in the vertical direction in FIG. 21. The magnetization of the magnet 101 of each of the first and second modification examples is in a direction from the S pole to the N pole of the plate-shaped portion 102 and perpendicular to the boundary between the S pole and the N pole.

FIG. 22 to FIG. 26 are cross-sectional views showing the third to seventh modification examples of the magnet 2, respectively. Like the magnet 2 shown in FIG. 1 to FIG. 3, the magnet 2 of each of the third to seventh modification examples has an end face 2a perpendicular to the rotation axis C (not shown), and has a magnetization in a direction perpendicular to the rotation axis C. The magnet 2 of each of the third to seventh modification examples includes a plate-shaped portion 3 including the end face 2a, and a ring-shaped portion 4 that is located on a side of the plate-shaped portion 3 farther from the end face 2a and coupled to the plate-shaped portion 3. The plate-shaped portion 3 of each of the third to seventh modification examples has the same shape as that of the plate-shaped portion 3 shown in FIG. 1 to FIG. 4. Like the ring-shaped portion 4 shown in FIG. 1 to FIG. 3 and FIG. 5, the ring-shaped portion 4 of each of the third to seventh modification examples includes a hollow 4a through which the rotation axis C passes. In the third to seventh modification examples, the ring-shaped portion 4 has an outer periphery and an inner periphery that are both circular in any cross section of the ring-shaped portion 4 perpendicular to the rotation axis C.

Figure 22:
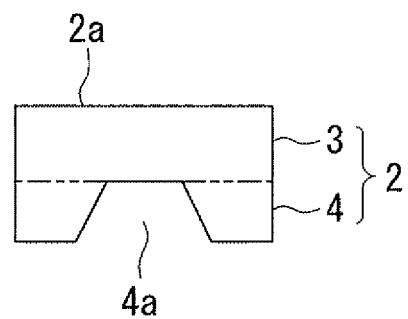
FIG. 22 is a cross-sectional view showing a third modification example of the magnet of the embodiment of the invention.
Figure 23:
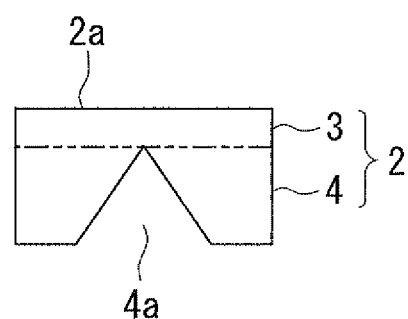
FIG. 23 is a cross-sectional view showing a fourth modification example of the magnet of the embodiment of the invention.
Figure 24:
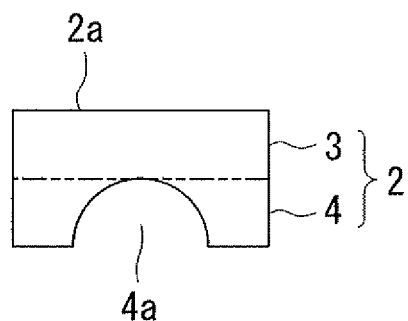
FIG. 24 is a cross-sectional view showing a fifth modification example of the magnet of the embodiment of the invention.

In the third to fifth modification examples shown in FIG. 22 to FIG. 24, the inner diameter of the ring-shaped portion 4, that is, the diameter of the hollow 4a, increases with increasing distance from the end face 2a of the magnet 2. As shown in FIG. 22, the hollow 4a of the third modification example has a frustum shape. In the fourth modification example, as shown in FIG. 23, the inner diameter of the ring-shaped portion 4, that is, the diameter of the hollow 4a, is zero at the boundary between the plate-shaped portion 3 and the ring-shaped portion 4. The hollow 4a of the fourth modification example has a conical shape. As shown in FIG. 24, the hollow 4a of the fifth modification example has a semispherical shape.

Figure 25:
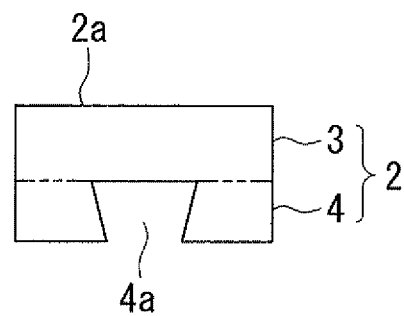
FIG. 25 is a cross-sectional view showing a sixth modification example of the magnet of the embodiment of the invention.
Figure 26:
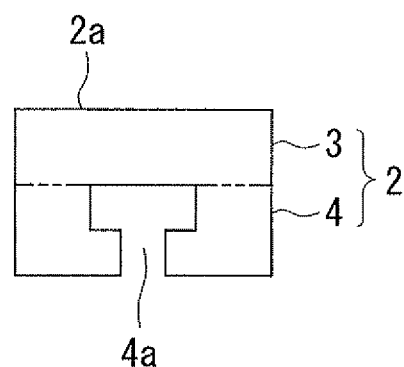
FIG. 26 is a cross-sectional view showing a seventh modification example of the magnet of the embodiment of the invention.

In the sixth modification example shown in FIG. 25, the inner diameter of the ring-shaped portion 4, that is, the diameter of the hollow 4a, decreases with increasing distance from the end face 2a of the magnet 2. In the seventh modification example shown in FIG. 26, the hollow 4a includes a first portion closer to the end face 2a and a second portion farther from the end face 2a. The first portion is greater in diameter than the second portion. The diameter of the first portion is constant regardless of the distance from the end face 2a. The diameter of the second portion is also constant regardless of the distance from the end face 2a.

Figure 27:
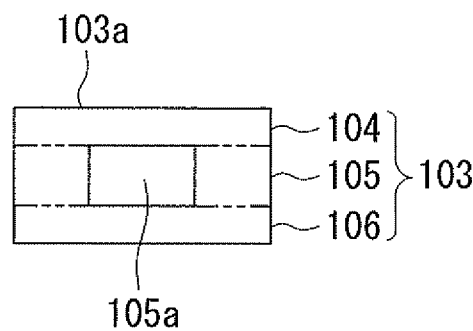
FIG. 27 is a cross-sectional view showing an eighth modification example of the magnet of the embodiment of the invention.

FIG. 27 is a cross-sectional view showing the eighth modification example of the magnet 2. Like the magnet 2 shown in FIG. 1 to FIG. 3, the magnet 103 of the eighth modification example has an end face 103a perpendicular to the rotation axis C (not shown), and has a magnetization in a direction perpendicular to the rotation axis C. The magnet 103 includes a first plate-shaped portion 104, a ring-shaped portion 105, and a second plate-shaped portion 106. The first plate-shaped portion 104 includes the end face 103a. The ring-shaped portion 105 is located on a side of the first plate-shaped portion 104 farther from the end face 103a and coupled to the first plate-shaped portion 104. The second plate-shaped portion 106 is located on a side of the ring-shaped portion 105 farther from the end face 103a and coupled to the ring-shaped portion 105. The first plate-shaped portion 104 corresponds to the plate-shaped portion according to the invention. Neither of the first and second plate-shaped portions 104 and 106 includes any hollow through which the rotation axis C passes, whereas the ring-shaped portion 105 includes a hollow 105a through which the rotation axis C passes. The first and second plate-shaped portions 104 and 106 are both shaped like a circular plate. The ring-shaped portion 105 has an outer periphery and an inner periphery that are both circular in any cross section of the ring-shaped portion 105 perpendicular to the rotation axis C. In the eighth modification example, the hollow 105a is defined by the first and second plate-shaped portions 104 and 106 and the ring-shaped portion 105.

The magnet 2 of the embodiment may be such that its planar shape (shape as viewed in a direction perpendicular to the end face) is as shown in FIG. 20 or FIG. 21 and the shape of any cross section including the rotation axis C is as shown in any one of FIG. 22 to FIG. 27. The magnet 2 of the embodiment may have a square, rectangular, hexagonal, or octagonal planar shape as long as the shape of any cross section including the rotation axis C is symmetric about the rotation axis C.

The present invention is not limited to the foregoing embodiment, and various modifications may be made thereto. For example, the magnetic sensor 5 may use anisotropic magnetoresistive (AMR) elements for all the magnetic detection elements in the bridge circuits 16 and 17.

It is apparent that the present invention can be carried out in various forms and modifications in the light of the foregoing descriptions. Accordingly, within the scope of the following claims and equivalents thereof, the present invention can be carried out in forms other than the foregoing most preferable embodiment.

What is claimed is:

1. A rotation angle sensor comprising:
    a magnet that rotates about a rotation axis, the magnet having an end face perpendicular to the rotation axis and having a magnetization in a direction perpendicular to the rotation axis; and
    a magnetic sensor that faces the end face of the magnet and detects a magnetic field produced by the magnet,
    the rotation angle sensor detecting a rotation angle of the magnet based on a detection output from the magnetic sensor, wherein:
    the magnet includes:
        a plate-shaped portion including the end face of the magnet; and
        a ring-shaped portion that is located on a side of the plate-shaped portion farther from the end face and coupled to the plate-shaped portion, and
    the plate-shaped portion does not include any hollow through which the rotation axis passes, whereas the ring-shaped portion includes a hollow through which the rotation axis passes, the rotation angle sensor being configured so that on a virtual plane that is parallel to the end face of the magnet and apart from the end face by a distance equal to a distance between the end face and the magnetic sensor, the magnetic field produced by the magnet is in directions parallel to each other at a first position and a second position, the first position being a position at which the rotation axis intersects the virtual plane, the second position being different from the first position.

2. The rotation angle sensor according to claim 1, wherein any cross section of the magnet including the rotation axis has a shape symmetric about the rotation axis.

3. The rotation angle sensor according to claim 2, wherein the plate-shaped portion is shaped like a circular plate, and the ring-shaped portion has an outer periphery and an inner periphery that are both circular in any cross section of the ring-shaped portion perpendicular to the rotation axis.

4. The rotation angle sensor according to claim 1, wherein the magnetic sensor includes a magnetoresistive element.

* * * * *